US012648428B2

(12) United States Patent
Inden

(10) Patent No.: US 12,648,428 B2
(45) Date of Patent: Jun. 2, 2026

(54) SEMICONDUCTOR DEVICE

(71) Applicant: Kioxia Corporation, Tokyo (JP)

(72) Inventor: Tomoya Inden, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 501 days.

(21) Appl. No.: 18/184,802

(22) Filed: Mar. 16, 2023

(65) Prior Publication Data

US 2023/0411283 A1 Dec. 21, 2023

(30) Foreign Application Priority Data

Jun. 17, 2022 (JP) ................................. 2022-098418

(51) Int. Cl.
| | |
|---|---|
| *H10W 20/43* | (2026.01) |
| *H10B 80/00* | (2023.01) |
| *H10W 20/00* | (2026.01) |
| *H10W 20/40* | (2026.01) |
| *H10W 20/42* | (2026.01) |
| *G11C 16/04* | (2006.01) |
| *H10W 20/44* | (2026.01) |
| *H10W 90/00* | (2026.01) |

(52) U.S. Cl.
CPC ............ *H10W 20/43* (2026.01); *H10B 80/00* (2023.02); *H10W 20/071* (2026.01); *H10W 20/42* (2026.01); *H10W 20/496* (2026.01); *H10W 20/498* (2026.01); *G11C 16/0483* (2013.01); *H10W 20/4441* (2026.01); *H10W 90/792* (2026.01)

(58) Field of Classification Search
CPC ............. H01L 23/528; H01L 21/76801; H01L 23/5223; H01L 23/5226
See application file for complete search history.

(56) References Cited

U.S. PATENT DOCUMENTS

| | | | |
|---|---|---|---|
| 8,093,923 B2 | 1/2012 | Shimizu | |
| 8,169,035 B2 * | 5/2012 | Takada ................. | H10D 84/811 |
| | | | 257/390 |

(Continued)

FOREIGN PATENT DOCUMENTS

| | | | | |
|---|---|---|---|---|
| JP | 2011187864 A | | 9/2011 | |
| JP | 2020047752 A | * | 3/2020 | ........ H10W 20/4441 |

(Continued)

*Primary Examiner* — Laura M Menz

(74) *Attorney, Agent, or Firm* — Maier & Maier, PLLC

(57) ABSTRACT

A semiconductor device includes a transistor including a first metallic-layer as a gate electrode above a front face of a substrate. A first wiring layer includes first to third elongate members constituted of the same material as the first metallic layer and extending in a first direction, and first and second connecting members constituted of the same material as the first metallic layer, extending in a second direction, and connecting the first to third elongate members. A second wiring layer is provided above the first metallic layer, and includes fourth to sixth elongate members extending in the first or second direction, and third and fourth connecting members constituted of the same material as that of the fourth to sixth elongate members, extending in the other of the first and second directions, and connecting the fourth to sixth elongate members. The first and second wiring layers are connected to each other.

16 Claims, 22 Drawing Sheets

(56) References Cited

U.S. PATENT DOCUMENTS

| | | | | |
|---|---|---|---|---|
| 8,372,720 | B2 * | 2/2013 | Fukuzumi | H10D 64/685 |
| | | | | 257/326 |
| 8,729,624 | B2 * | 5/2014 | Fukuzumi | H10B 99/00 |
| | | | | 257/326 |
| 9,035,374 | B2 * | 5/2015 | Fukuzumi | G11C 16/0483 |
| | | | | 257/E21.423 |
| 9,356,042 | B2 * | 5/2016 | Fukuzumi | H10B 43/27 |
| 9,741,738 | B2 * | 8/2017 | Fukuzumi | G11C 16/0483 |
| 9,960,116 | B2 | 5/2018 | Ohshima | |
| 9,985,050 | B2 * | 5/2018 | Fukuzumi | H10D 64/685 |
| 10,163,931 | B2 * | 12/2018 | Fukuzumi | H10B 43/20 |
| 10,958,250 | B2 | 3/2021 | Hashimoto et al. | |
| 11,171,086 | B2 * | 11/2021 | Kubo | H10W 20/498 |
| 11,393,840 | B2 * | 7/2022 | Fukuzumi | G11C 16/0483 |
| 11,574,926 | B2 * | 2/2023 | Fukuzumi | G11C 16/0483 |
| 11,844,180 | B2 * | 12/2023 | Okubo | H05K 1/181 |
| 11,844,218 | B2 * | 12/2023 | Fukuzumi | H10B 41/27 |
| 11,869,866 | B2 * | 1/2024 | Suzuki | H10W 20/063 |
| 12,058,862 | B2 * | 8/2024 | Fukuzumi | H10B 43/50 |
| 12,205,875 | B2 * | 1/2025 | Tsukiyama | H10W 70/685 |
| 12,300,697 | B2 * | 5/2025 | Inden | H10D 84/0177 |
| 12,342,628 | B2 * | 6/2025 | Futami | H10B 41/40 |
| 12,444,448 | B2 * | 10/2025 | Uenaka | G11C 7/1039 |
| 2007/0252201 | A1 * | 11/2007 | Kito | H10B 43/27 |
| | | | | 257/E21.679 |
| 2008/0160686 | A1 * | 7/2008 | Nakamatsu | H10D 84/811 |
| | | | | 438/210 |
| 2009/0108459 | A1 * | 4/2009 | Motoyui | H10W 20/484 |
| | | | | 257/773 |
| 2013/0126961 | A1 * | 5/2013 | Fukuzumi | H10B 43/20 |
| | | | | 257/324 |
| 2013/0127011 | A1 * | 5/2013 | Higashitani | H10D 1/714 |
| | | | | 257/532 |
| 2013/0130468 | A1 * | 5/2013 | Higashitani | H10B 43/35 |
| | | | | 257/E21.004 |
| 2013/0130495 | A1 * | 5/2013 | Higashitani | H10W 20/066 |
| | | | | 438/630 |
| 2014/0217493 | A1 * | 8/2014 | Fukuzumi | H10B 99/00 |
| | | | | 257/324 |
| 2015/0200204 | A1 * | 7/2015 | Fukuzumi | H10D 64/685 |
| | | | | 257/324 |
| 2016/0240554 | A1 * | 8/2016 | Fukuzumi | H10B 43/20 |
| 2016/0260792 | A1 * | 9/2016 | Kim | H10K 59/1213 |
| 2017/0330895 | A1 * | 11/2017 | Fukuzumi | H10B 41/27 |
| 2018/0240814 | A1 * | 8/2018 | Fukuzumi | G11C 16/0483 |
| 2019/0096908 | A1 * | 3/2019 | Fukuzumi | H10B 41/27 |
| 2020/0091064 | A1 * | 3/2020 | Iwasaki | H10W 20/40 |
| 2020/0091069 | A1 * | 3/2020 | Umezawa | H10W 20/435 |
| 2020/0119037 | A1 * | 4/2020 | Fukuzumi | H10B 43/50 |
| 2020/0288584 | A1 * | 9/2020 | Fujikawa | H05K 3/323 |

| | | | | |
|---|---|---|---|---|
| 2021/0066282 | A1 * | 3/2021 | Kim | H10D 88/00 |
| 2021/0066315 | A1 * | 3/2021 | Inden | G11C 16/0483 |
| 2021/0066325 | A1 * | 3/2021 | Inden | H10B 41/35 |
| 2021/0082916 | A1 * | 3/2021 | Inden | H10D 84/0177 |
| 2021/0167176 | A1 * | 6/2021 | Inden | H10D 64/0113 |
| 2021/0288017 | A1 * | 9/2021 | Suzuki | H10W 20/063 |
| 2021/0296327 | A1 * | 9/2021 | Inden | H10D 84/85 |
| 2021/0375923 | A1 * | 12/2021 | Hishida | G11C 5/063 |
| 2022/0028892 | A1 * | 1/2022 | Fukuzumi | H10B 99/00 |
| 2022/0068804 | A1 * | 3/2022 | Takekida | H10B 43/10 |
| 2022/0149053 | A1 * | 5/2022 | Lee | H10B 43/27 |
| 2022/0157863 | A1 * | 5/2022 | Yamamoto | H10D 86/201 |
| 2022/0278084 | A1 * | 9/2022 | Ong | H10W 70/611 |
| 2022/0302106 | A1 * | 9/2022 | Futami | H10B 43/40 |
| 2022/0320138 | A1 * | 10/2022 | Fukuzumi | H10B 43/27 |
| 2022/0359560 | A1 * | 11/2022 | Bae | H10B 43/27 |
| 2022/0384561 | A1 | 12/2022 | Tomita et al. | |
| 2022/0394862 | A1 * | 12/2022 | Okubo | H05K 1/181 |
| 2022/0399276 | A1 * | 12/2022 | Inden | H10B 43/27 |
| 2022/0406711 | A1 * | 12/2022 | Mizumoto | H10W 20/493 |
| 2023/0058480 | A1 * | 2/2023 | Tsukiyama | H10W 70/685 |
| 2023/0069025 | A1 * | 3/2023 | Nakajima | H10W 20/032 |
| 2023/0085314 | A1 * | 3/2023 | Kitamura | H10W 70/65 |
| | | | | 257/668 |
| 2023/0088785 | A1 * | 3/2023 | Ide | G06F 1/185 |
| | | | | 361/679.31 |
| 2023/0146470 | A1 * | 5/2023 | Fukuzumi | H10B 43/50 |
| | | | | 257/314 |
| 2023/0206996 | A1 * | 6/2023 | Salahuddin | G11C 11/419 |
| | | | | 365/154 |
| 2023/0207564 | A1 * | 6/2023 | Inden | H10D 84/0177 |
| | | | | 257/371 |
| 2023/0225121 | A1 * | 7/2023 | Inden | H10B 41/35 |
| | | | | 257/314 |
| 2023/0307419 | A1 * | 9/2023 | Homma | H10W 90/00 |
| 2023/0328977 | A1 * | 10/2023 | Park | H10B 41/35 |
| 2023/0395497 | A1 * | 12/2023 | Yamasaki | H10B 43/27 |
| 2023/0411283 | A1 * | 12/2023 | Inden | H10D 1/474 |
| 2023/0420007 | A1 * | 12/2023 | Uenaka | G11C 7/1039 |
| 2024/0008251 | A1 * | 1/2024 | Sharma | H10B 12/05 |
| 2024/0347525 | A1 * | 10/2024 | Onda | H10D 89/10 |
| 2024/0365549 | A1 * | 10/2024 | Fukuzumi | H10B 43/20 |
| 2025/0234642 | A1 * | 7/2025 | Inden | H10D 84/0177 |

FOREIGN PATENT DOCUMENTS

| | | | | |
|---|---|---|---|---|
| JP | 202172365 A | | 5/2021 | |
| JP | 2023184334 A | * | 12/2023 | H10W 20/498 |
| KR | 20170044565 A | * | 4/2017 | H10W 20/0698 |
| WO | WO-2009075370 A1 | * | 6/2009 | G11C 16/0483 |
| WO | WO-2022059177 A1 | * | 3/2022 | H10D 30/60 |

* cited by examiner

GRES

100a

SEMICONDUCTOR DEVICE

CROSS REFERENCE TO RELATED APPLICATIONS

This application is based upon and claims the benefit of priority from the prior Japanese Patent Application No. 2022-098418, filed on Jun. 17, 2022, the entire contents of which are incorporated herein by reference.

FIELD

The embodiments of the present invention relate to a semiconductor device.

BACKGROUND

In recent years, a metallic material lower in the resistance than metallic silicide is sometimes used as a material of a gate electrode of a transistor. In this case, the layout area of a resistive element constituted of the same material as that of the gate electrode adversely increases while the operation of the transistor is speeded up.

DETAILED DESCRIPTION

Figure 1:
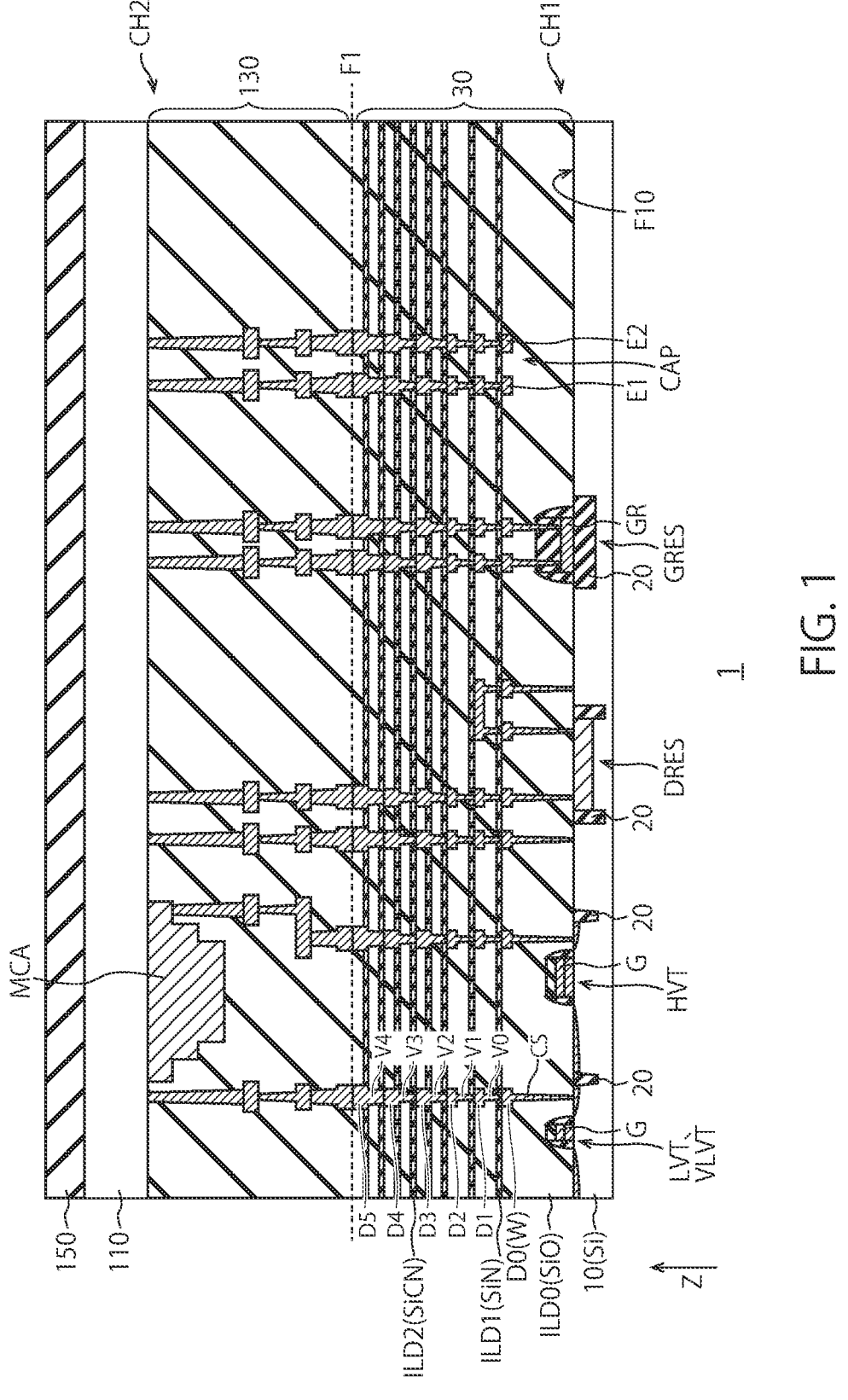
FIG. 1 is a cross-sectional view illustrating a configuration example of a semiconductor device according to a first embodiment.

Embodiments will now be explained with reference to the accompanying drawings. The present invention is not limited to the embodiments. In the embodiments, "an upper direction" or "a lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor device according to the present embodiment includes a substrate. A transistor includes a first metallic layer as a gate electrode above a front face of the substrate. A first wiring layer includes first to third elongate members constituted of the same material as that of the first metallic layer and extending in a first direction in a plane substantially parallel to the front face of the substrate, and first and second connecting members constituted of the same material as that of the first metallic layer, extending in a second direction intersecting with the first direction, and connecting ends portions of the first to third elongate members. A second wiring layer is provided above the first metallic layer, and includes fourth to sixth elongate members extending in one of the first and second directions, and third and fourth connecting members constituted of the same material as that of the fourth to sixth elongate members, extending in the other of the first and second directions, and connecting end portions of the fourth to sixth elongate members. One end portions of the first and second wiring layers are electrically connected to each other.

First Embodiment

FIG. 1 is a cross-sectional view illustrating a configuration example of a semiconductor device according to a first embodiment. In the present embodiment, a semiconductor device 1 is, for example, a NAND flash memory. The semiconductor device 1 includes a CMOS (Complementary Metal Oxide Semiconductor) chip CH1 having a CMOS circuit and a cell array chip CH2 having a memory cell array MCA, which are bonded to each other on a bonding face F1.

The CMOS chip CH1 includes a substrate 10, an ultralow voltage transistor VLVT, a low voltage transistor LVT, a high voltage transistor HVT, a diffusion resistive element DRES, a gate resistive element GRES, a capacitive element CAP, and a multi-layered wiring layer 30.

The ultralow voltage transistor VLVT, the low voltage transistor LVT, and the high voltage transistor HVT (hereinafter, also collectively "transistors VLVT, LVT, and HVT") are examples of semiconductor elements provided on the substrate 10. The substrate 10 is, for example, a silicon substrate. Element isolating parts 20 (STIs (Shallow Trench Isolations)) are provided on the front face of the substrate 10 and define active areas. The transistors VLVT, LVT, and HVT are provided in the active areas of the front face of the substrate 10. Each of the transistors VLVT, LVT, and HVT has a gate dielectric film (not illustrated) provided on the front face of the substrate 10, a gate electrode G provided on the gate dielectric film, a source diffusion layer provided on the substrate 10 on one side of the gate electrode G, and a drain diffusion layer provided on the substrate 10 on the other side of the gate electrode G. The gate electrode G is constituted of a low resistance material such as tungsten, titanium, or titanium nitride or a film stack including these materials as a first metallic layer. With use of such a low resistance material for the gate electrode G, the high-speed operations of the transistors VLVT, LVT, and HVT are realized.

The diffusion resistive element DRES may be a resistive element constituted of the same impurity diffused layer as the source diffusion layers and the drain diffusion layers of the transistors VLVT, LVT, and HVT. The diffusion resistive element DRES is set to a resistance value in a predetermined range by impurities implanted to the front face of the substrate 10. Of source, the diffusion resistive element DRES may be constituted of a different impurity diffused layer from the source diffusion layers and the drain diffusion layers.

The gate resistive element GRES includes a resistive member GR formed in the same material layer as that of the gate electrode G and constituted of the same material as that of the gate electrode G. Since the resistive member GR is low in the resistance similarly to the gate electrode G in this case, the resistive member GR needs to be formed in an elongate shape to obtain a resistance value in a predetermined range, which leads to an increase in the layout area. Accordingly, in the present embodiment, the gate resistive element GRES includes not only the resistive member GR but also wiring layers of the multi-layered wiring layer 30 as resistive members. A more detailed configuration of the gate resistive element GRES will be described later.

The capacitive element CAP includes an electrode E1 and an electrode E2 provided in the same layers as wiring layers of the multi-layered wiring layer 30. The electrodes E1 and E2 are formed, for example, in the same material layers as those of wiring layers D0 to D5 which will be described later, and are constituted of the same material. An insulating layer ILD0 is interposed between the electrode E1 and the electrode E2 and insulates the electrode E1 and the electrode E2 from each other.

A spacer or a liner layer made of an insulating material may be provided around the gate electrode G and the resistive member GR.

The multi-layered wiring layer 30 is provided on the transistors VLVT, LVT, and HVT, the diffusion resistive element DRES, and the gate resistive element GRES. The multi-layered wiring layer 30 includes a plurality of wiring layers D0 to D5, a plurality of insulating layers ILD0 to ILD2, and a plurality of contacts CS and V0 to V4.

The wiring layers D0 to D5 are stacked on the front face of the substrate 10 in a direction (a Z direction) substantially perpendicular thereto. The wiring layers D0 to D5 are patterned in desired layouts and are connected to any lines or contacts, respectively. For example, a low-resistance metallic material such as tungsten or copper is used as the wiring layers D0 to D5.

Any of the insulating layers ILD0 to ILD2 is interposed between the wiring layers D0 to D5. For example, a silicon dioxide film ($SiO_2$) is used as the insulating layer ILD0. For example, a silicon nitride film (SiN) is used as the insulating layer ILD1. For example, a silicon carbonitride film (SiCN) is used as the insulating layer ILD2.

The contacts CS and V0 to V4 penetrate through the insulating layers ILD0 to ILD2 to electrically connect the substrate 10 and the wiring layer D0 to each other or the wiring layers D0 to D5 to each other. For example, a low-resistance metallic material such as tungsten or copper is used as the contacts CS and V0 to V4.

The cell array chip CH2 includes a substrate 110, the memory cell array MCA, a multi-layered wiring layer 130, and a metallic layer 150. The substrate 110 is, for example, a silicon substrate. The memory cell array MCA is provided on the substrate 110 and may be a three-dimensional memory cell array where a plurality of memory cells are arrayed three-dimensionally.

The multi-layered wiring layer 130 includes a plurality of wiring layers, a plurality of insulating layers, and a plurality of contacts similarly to the multi-layered wiring layer 30. The multi-layered wiring layer 130 electrically connects semiconductor elements such as the memory cell array MCA formed on the cell array chip CH2 and the CMOS chip CH1 to each other. A wiring layer or pads exposed on the bonding face F1 of the multi-layered wiring layer 130 are bonded to the wiring layer D5 of the multi-layered wiring layer 30 of the CMOS chip CH1. This enables the semiconductor elements such as the transistors VLVT, LVT, and HVT, the diffusion resistive element DRES, and the gate resistive element GRES of the CMOS chip CH1 to be electrically connected to the memory cell array MCA of the cell array chip CH2.

Figure 2:
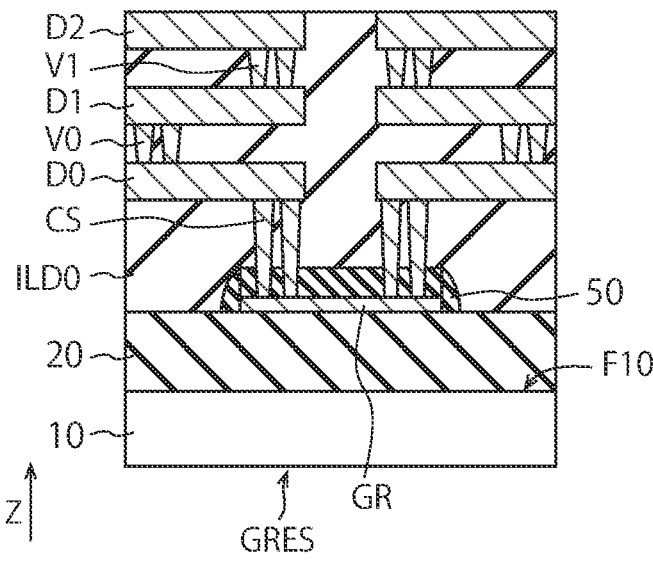
FIG. 2 is a cross-sectional view illustrating a configuration of a gate resistive element in more detail.
Figure 3:
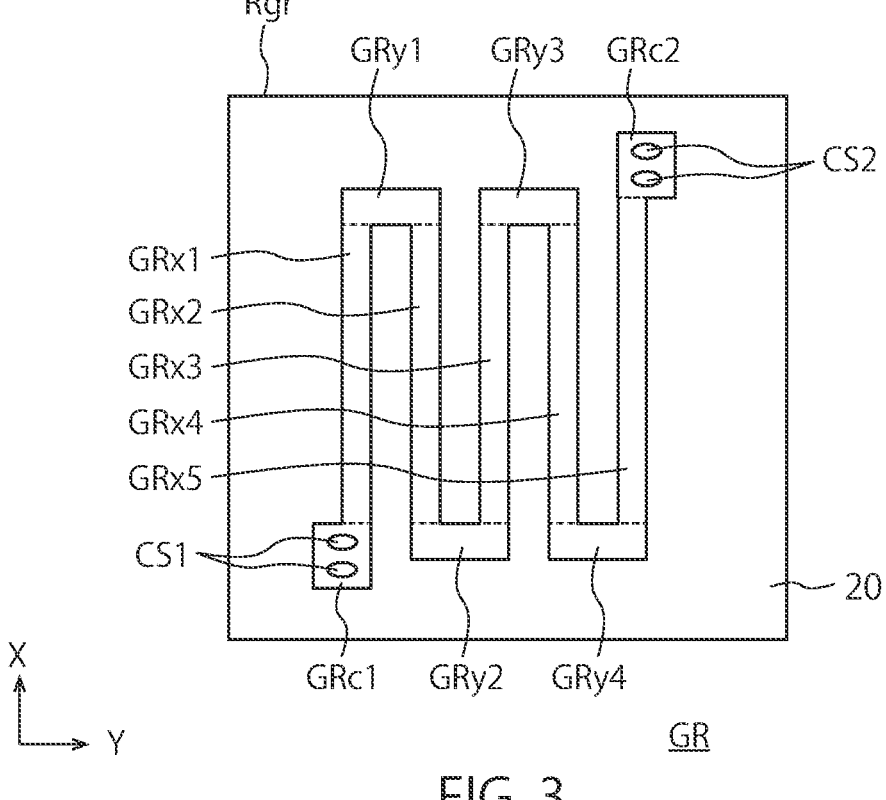
FIG. 3 is a plan view illustrating a configuration of a resistive member of the gate resistive element.

FIG. 2 is a cross-sectional view illustrating the configuration of the gate resistive element GRES in more detail. FIG. 3 is a plan view illustrating a configuration of the resistive member GR of the gate resistive element GRES. The resistive member GR of the gate resistive element GRES is provided on the element isolating part 20 and is meandering in a planar view as viewed from above a front face F10 of the substrate 10 as illustrated in FIG. 3. In FIG. 3, the contacts CS are illustrated as contacts CS1 and CS2 to be distinguished from each other.

As illustrated in FIG. 3, the resistive member GR includes a plurality of elongate members GRx1 to GRx5, a plurality of connecting members GRy1 to GRy4, and contact regions GRc1 and GRc2. The resistive member GR is constituted of the same material as that of the gate electrode G in the same material layer.

The elongate members GRx1 to GRx5 are members extending in an X direction in a plan substantially parallel to the front face F10 of the substrate 10. The elongate members GRx1 to GRx5 may be rectangles, ellipses, or the like having the long sides or the long diameter in the X direction.

The connecting members GRy1 to GRy4 extend in a Y direction intersecting with the X direction in the plan substantially parallel to the front face F10 and connect end portions of the elongate members GRx1 to GRx5. For example, the connecting member GRy1 connects one ends of the elongate members GRx1 and GRx2 to each other. The connecting member GRy2 connects the other end of the elongate member GRx2 and one end of the elongate member GRx3 to each other. The connecting member GRy3 connects the other end of the elongate member GRx3 and one end of the elongate member GRx4 to each other. The connecting member GRy4 connects the other end of the elongate member GRx4 and one end of the elongate member GRx5 to each other.

The contact region GRc1 is connected to the other end of the elongate member GRx1 and electrically connects the contacts CS1 and the resistive member GR to each other. The contact region GRc2 is connected to the other end of the elongate member GRx5 and electrically connects other contacts CS2 and the resistive member GR to each other. The contact regions GRc1 and GRc2 are electrically connected to end portions of the wiring layer D0 located above the resistive member GR via the contacts CS1 and CS2, respectively.

As described above, in the present embodiment, the elongate members GRx1 to GRx5 having the longitudinal direction in the X direction are arrayed in the Y direction, and the connecting members GRy1 to GRy4 extending in the Y direction alternately connect the end portions of the elongate members GRx1 to GRx5. Accordingly, the resistive member GR is configured to be meandering in a planar view as viewed from the Z direction.

Figures 4, 5:
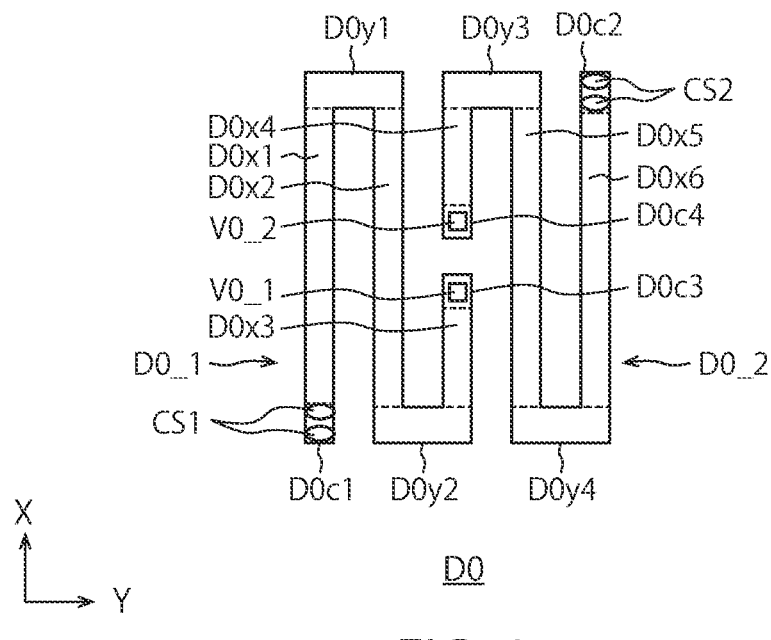
FIG. 4 is a plan view illustrating a configuration of a wiring layer of the gate resistive element.
FIG. 5 is a plan view illustrating a configuration of a wiring layer of the gate resistive element.

FIG. 4 is a plan view illustrating a configuration of the wiring layer D0 of the gate resistive element GRES. The wiring layer D0 of the gate resistive element GRES is provided above the resistive member GR and overlaps with the resistive member GR on the upper side as illustrated in FIG. 2. As illustrated in FIG. 4, the wiring layer D0 is meandering in the planar view as viewed from above the front face F10 of the substrate 10 and is constituted of a low-resistance metallic material (for example, tungsten) of the same level as that of the resistive member GR (for example, a film stack of Ti/TiN/W (Titanium/Titanium Nitride/Tungsten)). Therefore, the wiring layer D0 also functions as a resistive member of the gate resistive element GRES similarly to the resistive member GR.

As illustrated in FIG. 4, the wiring layer D0 includes a plurality of elongate members D0x1 to D0x6, a plurality of connecting members D0y1 to D0y4, and contact regions D0c1 to D0c4. The elongate members D0x1 to D0x6 are members extending in the X direction. The elongate members D0x1 to D0x6 may be rectangles, ellipses, or the like having the long sides or the long diameter in the X direction.

The connecting members D0y1 to D0y4 extend in the Y direction and connect end portions of the elongate members D0x1 to D0x6. For example, the connecting member D0y1 connects one ends of the elongate members D0x1 and D0x2 to each other. The connecting member D0y2 connects the other end of the elongate member D0x2 and one end of the elongate member D0x3 to each other. The connecting member D0y3 connects one ends of the elongate members D0x4 and D0x5 to each other. The connecting member D0y4 connects the other end of the elongate member D0x5 and one end of the elongate member D0x6 to each other.

The wiring layer D0 includes a wiring layer D0_1 composed of the elongate members D0x1 to D0x3 and the connecting members D0y1 and D0y2, and a wiring layer D0_2 composed of the elongate members D0x4 to D0x6 and the connecting members D0y3 and D0y4. These two wiring layers D0_1 and D0_2 are electrically separated from each other. The wiring layer D0_1 is electrically connected to the contact region GRc1 at one end of the resistive member GR via the contact region D0c1. The wiring layer D0_2 is electrically connected to the contact region GRc2 at the other end of the resistive member GR via the contact region D0c2.

The contact region D0c1 is connected to the other end of the elongate member D0x1 and electrically connects the contacts CS1 and the wiring layer D0_1 to each other. As illustrated in FIG. 2, the contacts CS penetrate through the insulating layer ILD0 to be connected to the resistive member GR. Therefore, the contact region D0c1 is electrically connected to the contact region GRc1 via the contacts CS1. That is, one end (D0c1) of the wiring layer D0_1 is electrically connected to one end (GRc1) of the resistive member GR in FIG. 3.

The contact region D0c2 is connected to the other end of the elongate member D0x6 and electrically connects the contacts CS2 and the wiring layer D0_2 to each other. The contact region D0c2 is electrically connected to the contact region GRc2 via the contacts CS2. That is, the other end (D0c2) of the wiring layer D0_2 is electrically connected to the other end (GRc2) of the resistive member GR in FIG. 3.

The contact region D0c3 is connected to the other end of the elongate member D0x3 and electrically connects a contact V0_1 and the wiring layer D0_1 to each other. The contact region D0c4 is connected to the other end of the elongate member D0x4 and electrically connects a contact V0_2 and the wiring layer D0_2 to each other. The contact regions D0c3 and D0c4 are electrically connected to the wiring layer D1 located above the wiring layer D0 via the contacts V0_1 and V0_2, respectively.

As described above, in the present embodiment, the elongate members D0x1 to D0x6 having the longitudinal direction in the X direction are arrayed in the Y direction, and the connecting members D0y1 to D0y4 extending in the Y direction alternately connect the end portions of the elongate members D0x1 to D0x6 in a continuous manner. Accordingly, the wiring layer D0 is configured to be meandering in the planar view as viewed from the Z direction.

FIG. 5 is a plan view illustrating a configuration of the wiring layer D1 of the gate resistive element GRES. The wiring layer D1 of the gate resistive element GRES is provided above the resistive member GR and the wiring layer D0 as illustrated in FIG. 2, and is meandering in the planar view as viewed from above the front face F10 of the substrate 10 as illustrated in FIG. 5 and overlaps with the resistive member GR and the wiring layer D0 on the upper side. The wiring layer D1 is constituted of a low-resistance metallic material (for example, tungsten) similarly to the wiring layer D0. Therefore, the wiring layer D1 also functions as a resistive member of the gate resistive element GRES similarly to the resistive member GR and the wiring layer D0.

As illustrated in FIG. 5, the wiring layer D1 includes a plurality of elongate members D1x1 to D1x6, a plurality of connecting members D1y1 to D1y4, and contact regions D1c1 to D1c4.

The elongate members D1x1 to D1x6 are members extending in the X direction. The elongate members D1x1 to D1x6 may be rectangles, ellipses, or the like having the long sides or the long diameter in the X direction.

The connecting members D1y1 to D1y4 extend in the Y direction and connect end portions of the elongate members D1x1 to D1x6. For example, the connecting member D1y1 connects one ends of the elongate members D1x1 and D1x2 to each other. The connecting member D1y2 connects the other end of the elongate member D1x2 and one end of the elongate member D1x3 to each other. The connecting member D1$y$3 connects one ends of the elongate members D1$x$4 and D1$x$5 to each other. The connecting member D1$y$4 connects the other end of the elongate member D1$x$5 and one end of the elongate member D1$x$6 to each other.

The wiring layer D1 includes a wiring layer D1_1 composed of the elongate members D1$x$1 to D1$x$3 and the connecting members D1$y$1 and D1$y$2, and a wiring layer D1_2 composed of the elongate members D1$x$4 to D1$x$6 and the connecting members D1$y$3 and D1$y$4 and these two wiring layers D1_1 and D1_2 are electrically separated from each other. The wiring layer D1_1 is electrically connected to the contact region GRc1 at one end of the resistive member GR via a contact region D1$c$3, the contact V0_1, and the wiring layer D0_1. The wiring layer D1_2 is electrically connected to the contact region GRc2 at the other end of the resistive member GR via a contact region D1$c$4, the contact V0_2, and the wiring layer D0_2.

The contact region D1$c$3 is connected to the other end of the elongate member D1$x$3 and electrically connects the contact V0_1 and the wiring layer D1_1 to each other. The contact V0_1 is connected to the contact region D0$c$3 of the wiring layer D0 in FIG. 4. Therefore, the contact region D1$c$3 is electrically connected to the contact region D0$c$3 via the contact V0_1. That is, one end (D1$c$3) of the wiring layer D1_1 is electrically connected to one end (D0$c$3) of the wiring layer D0_1 in FIG. 4.

The contact region D1$c$4 is connected to the other end of the elongate member D1$x$4 and electrically connects the contact V0_2 and the wiring layer D1_2 to each other. The contact V0_2 is connected to the contact region D0$c$4 of the wiring layer D0_2 in FIG. 4. Therefore, the contact region D1$c$4 is electrically connected to the contact region D0$c$4 via the contact V0_2. That is, the other end (D1$c$4) of the wiring layer D1_2 is electrically connected to the other end (D0$c$4) of the wiring layer D0_2 in FIG. 4.

The contact region D1$c$1 is connected to the other end of the elongate member D1$x$1 and electrically connects a contact V1_1 and the wiring layer D1_1 to each other. The contact region D1$c$2 is connected to the other end of the elongate member D1$x$6 and electrically connects a contact V1_2 and the wiring layer D1_2 to each other. The contact regions D1$c$1 and D1$c$2 are electrically connected to the wiring layer D2 located above the wiring layer D1 via the contacts V1_1 and V1_2, respectively.

As described above, in the present embodiment, the elongate members D1$x$1 to D1$x$6 having the longitudinal direction in the X direction are arrayed in the Y direction, and the connecting members D1$y$1 to D1$y$4 extending in the Y direction alternately connect the end portions of the elongate members D1$x$1 to D1$x$6. Accordingly, the wiring layer D1 is configured to be meandering in the planar view as viewed from the Z direction.

Figure 6:
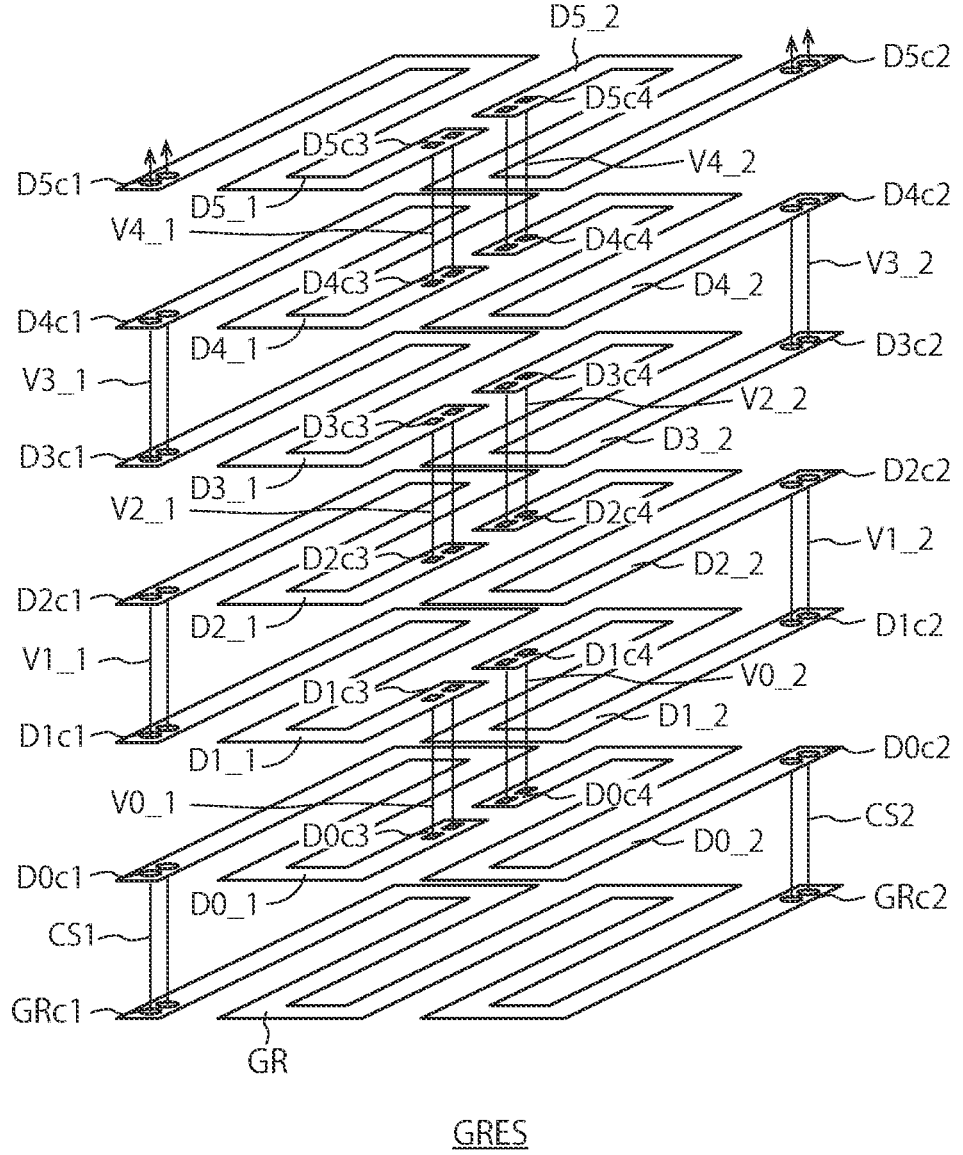
FIG. 6 is a schematic perspective view illustrating a configuration example of the entire gate resistive element.

As illustrated in FIG. 6, the wiring layers D2 to D5 also have the same configurations as those of the wiring layers D0 and D1. The wiring layer D2 is provided above the wiring layer D1 and has two meandering wiring layers D2_1 and D2_2. The wiring layer D3 is provided above the wiring layer D2 and has two meandering wiring layers D3_1 and D3_2. The wiring layer D4 is provided above the wiring layer D3 and has two meandering wiring layers D4_1 and D4_2. The wiring layer D5 is provided above the wiring layer D4 and has two meandering wiring layers D5_1 and D5_2.

The wiring layers D2_1, D3_1, D4_1, and D5_1 that are respectively ones of the wiring layers D2 to D5 are electrically connected to the contact region GRc1 at one end of the resistive member GR via the wiring layers D1_1 and D0_1.

The wiring layers D2_2, D3_2, D4_2, and D5_2 that are respectively the others of the wiring layers D2 to D5 are electrically connected to the contact region GRc2 at the other end of the resistive member GR via the wiring layers D1_2 and D0_2.

Accordingly, as illustrated in FIG. 6, the wiring layers D0_1 to D5_1 that are respectively ones of the wiring layers D0 to D5 are electrically connected to one end of the resistive member GR while being electrically separated from the wiring layers D0_2 to D5_2 that are respectively the others of the wiring layers D0 to D5. The wiring layers D0_2 to D5_2 that are respectively the others of the wiring layers D0 to D5 are electrically connected to the other end of the resistive member GR. Contact regions D5$c$1 and D5$c$2 at the other ends of two lines of the uppermost wiring layer D5 are electrically connected to the semiconductor elements of the CMOS chip CH1 via lines (not illustrated).

FIG. 6 is a schematic perspective view illustrating a configuration example of the entire gate resistive element GRES. The resistive member GR has a continuous meandering shape. The contact regions GRc1 and GRc2 at both ends of the resistive member GR are arranged at diagonal positions of a formation region Rgr of the gate resistive element GRES in FIG. 3, respectively. The contact regions GRc1 and GRc2 are electrically connected to the contact regions D0$c$1 and D0$c$2 of the wiring layer D0 via the contacts CS1 and CS2, respectively.

The two wiring layers D0_1 and D0_2 of the wiring layer D0 are both meandering and are electrically separated from each other. The contact regions D0$c$1 and D0$c$2 at one ends of the wiring layers D0_1 and D0_2 are arranged at the diagonal positions of the formation region Rgr, respectively, and the contact regions D0$c$3 and D0$c$4 at the other ends are arranged near the center of the formation region Rgr. The contact regions D0$c$3 and D0$c$4 are electrically connected to the contact regions D1$c$3 and D1$c$4 of the wiring layer D1 via the contacts V0_1 and V0_2, respectively.

The two wiring layers D1_1 and D1_2 of the wiring layer D1 are both meandering and are electrically separated from each other. The contact regions D1$c$3 and D1$c$4 at one ends of the wiring layers D1_1 and D1_2 are arranged near the center of the formation region Rgr and the contact regions D1$c$1 and D1$c$2 at the other ends are arranged at the diagonal positions of the formation region Rgr, respectively. The contact regions D1$c$1 and D1$c$2 are electrically connected to contact regions D2$c$1 and D2$c$2 of the wiring layer D2 via the contacts V1_1 and V1_2, respectively.

The two wiring layers D2_1 and D2_2 of the wiring layer D2 are both meandering and are electrically separated from each other. The contact regions D2$c$1 and D2$c$2 at one ends of the wiring layers D2_1 and D2_2 are arranged at the diagonal positions of the formation region Rgr, respectively, and contact regions D2$c$3 and D2$c$4 at the other ends are arranged near the center of the formation region Rgr. The contact regions D2$c$3 and D2$c$4 are electrically connected to contact regions D3$c$3 and D3$c$4 of the wiring layer D3 via contacts V2_1 and V2_2, respectively.

The two wiring layers D3_1 and D3_2 of the wiring layer D3 are both meandering and are electrically separated from each other. The contact regions D3$c$3 and D3$c$4 at one ends of the wiring layers D3_1 and D3_2 are arranged near the center of the formation region Rgr and contact regions D3$c$1 and D3$c$2 at the other ends are arranged at the diagonal positions of the formation region Rgr, respectively. The contact regions D3$c$1 and D3$c$2 are electrically connected to contact regions D4$c$1 and D4$c$2 of the wiring layer D4 via contacts V3_1 and V3_2, respectively.

The two wiring layers D4_1 and D4_2 of the wiring layer D4 are both meandering and are electrically separated from each other. The contact regions D4c1 and D4c2 at one ends of the wiring layers D4_1 and D4_2 are arranged at the diagonal positions of the formation region Rgr, respectively, and contact regions D4c3 and D4c4 at the other ends are arranged near the center of the formation region Rgr. The contact regions D4c3 and D4c4 are electrically connected to contact regions D5c3 and D5c4 of the wiring layer D5 via contacts V4_1 and V4_2, respectively.

The two wiring layers D5_1 and D5_2 of the wiring layer D5 are both meandering and are electrically separated from each other. The contact regions D5c3 and D5c4 at one ends of the wiring layers D5_1 and D5_2 are arranged near the center of the formation region Rgr and the contact regions D5c1 and D5c2 at the other ends are arranged at the diagonal positions of the formation region Rgr, respectively. The contact regions D5c1 and D5c2 are electrically connected to any semiconductor elements of the CMOS chip CH1 (not illustrated), respectively.

As described above, the connection locations of the resistive member GR and the wiring layers D0 to D5 are alternately arranged at the diagonal positions and the central positions of the formation region Rgr of the gate resistive element GRES in each of the layers from the bottom to the top. Accordingly, the gate resistive element GRES according to the present embodiment is wired to be meandering in the resistive member GR and the wiring layers D0 to D5 while alternately passing the diagonal positions and the positions near the center of the formation region Rgr. Since the gate resistive element GRES is meandering not only in the resistive member GR but also in the wiring layers D0 to D5 stacked thereon, the wiring distance is increased. As a result, the gate resistive element GRES can be easily set to a resistance value in a desired range while it is constituted of a material low in the sheet resistance and is small in the planar layout area. Furthermore, the number of the wiring layers can be decreased. Accordingly, the semiconductor device 1 can be downscaled while the operations of the transistors VLVT, LVT, and HVT are speeded up.

Second Embodiment

Figure 7:
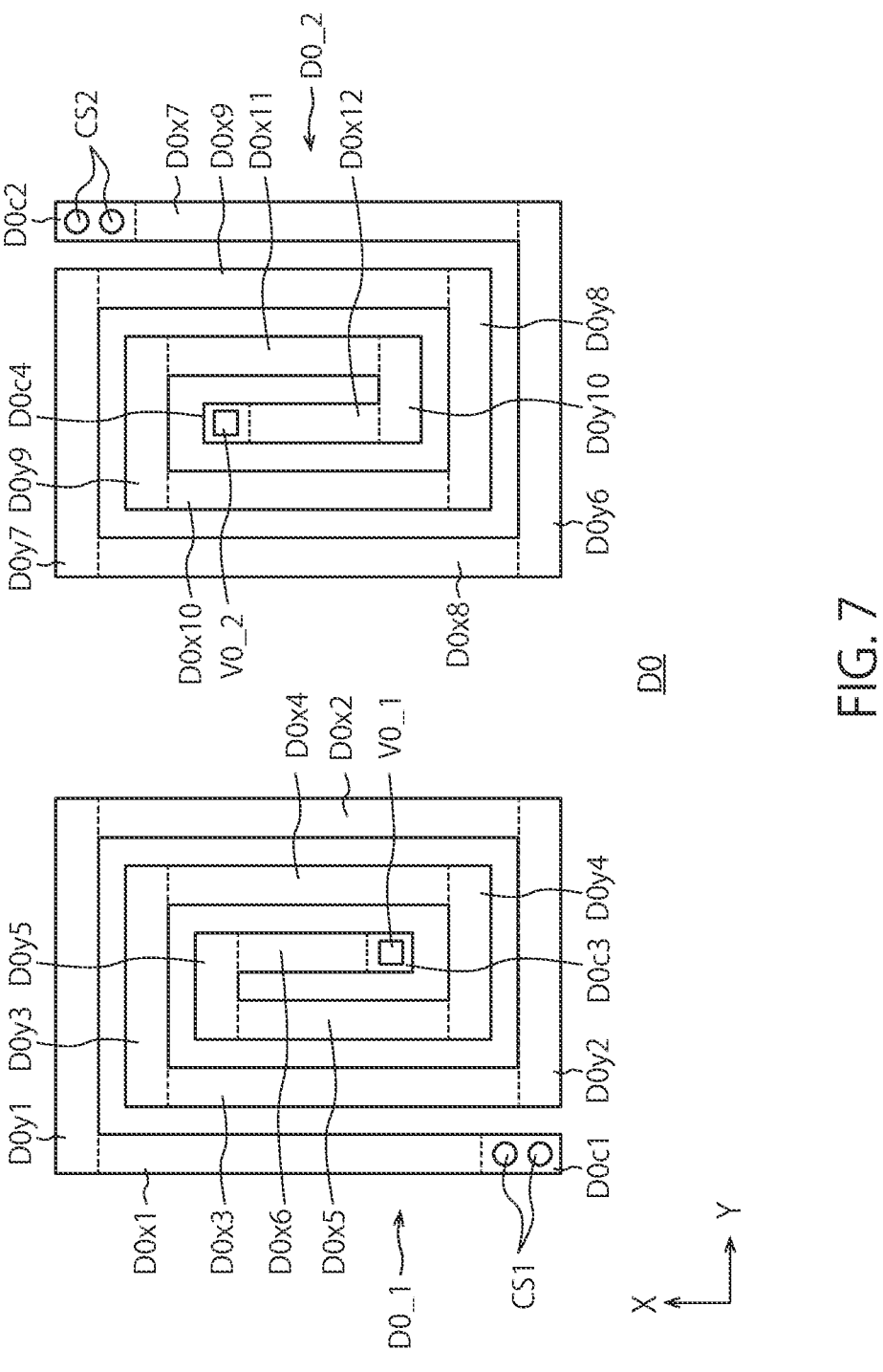
FIG. 7 is a plan view illustrating a configuration of a wiring layer according to a second embodiment.

FIG. 7 is a plan view illustrating a configuration of the wiring layer D0 according to a second embodiment. In the second embodiment, the wiring layer D0 has a spiral shape and overlaps with the resistive member GR in the planar view as viewed from the Z direction. The wiring layer D0 is constituted of a low-resistance metallic material (for example, tungsten) of the same level as that of the resistive member GR (for example, a film stack of Ti/TiN/W). Therefore, the wiring layer D0 also functions as a resistive member of the gate resistive element GRES similarly to the resistive member GR. The resistive member GR and other wiring layers D1 to D5 also may have the same configuration as that of the wiring layer D0. Therefore, the configuration of the wiring layer D0 is described below and detailed explanations of the resistive member GR and the other wiring layers D1 to D5 are omitted.

As illustrated in FIG. 7, the wiring layer D0 includes wiring layers D0_1 and D0_2 provided above the resistive member GR. The wiring layer D0_1 includes elongate members D0x1 to D0x6, connecting members D0y1 to D0y5, and contact regions D0c1 and D0c3. The elongate members D01x to D0x6 are members extending in the X direction. The elongate members D0x1 to D0x6 may be rectangles, ellipses, or the like having the long sides or the long diameter in the X direction.

The connecting members D0y1 to D0y5 extend in the Y direction and connect end portions of the elongate members D0x1 to D0x6. For example, the connecting member D0y1 connects one ends of the elongate members D0x1 and D0x2 to each other. The connecting member D0y2 connects the other end of the elongate member D0x2 and one end of the elongate member D0x3 to each other. The connecting member D0y3 connects the other end of the elongate member D0x3 and one end of the elongate member D0x4 to each other. The connecting member D0y4 connects the other end of the elongate member D0x4 and one end of the elongate member D0x5 to each other. The connecting member D0y5 connects the other end of the elongate member D0x5 and one end of the elongate member D0x6 to each other.

The contact region D0c1 is connected to the other end of the elongate member D0x1 and electrically connects contacts CS1 and the elongate member D0x1 to each other. Accordingly, the contact region D0c1 is electrically connected to the contact region GRc1 via the contacts CS1. That is, one end (D0c1) of the wiring layer D0_1 is electrically connected to one end of the resistive member GR.

The contact region D0c3 is connected to the other end of the elongate member D0x6 and electrically connects a contact V0_1 and the elongate member D0x6 to each other. Accordingly, the contact region D0c3 is electrically connected to the wiring layer D1 located above the wiring layer D0 via the contact V0_1. That is, the other end (D0c3) of the wiring layer D0_1 is electrically connected to one end of the wiring layer D1.

The wiring layer D0_2 includes elongate members D0x7 to D0x12, connecting members D0y6 to D0y10, and contact regions D0c2 and D0c4. The elongate members D0x7 to D0x12 are members extending in the X direction. The elongate members D0x7 to D0x12 may be rectangles, ellipses or the like having the long sides or the long diameter in the X direction.

The connecting members D0y6 to D0y10 extend in the Y direction and connect end portions of the elongate members D0x7 to D0x12. For example, the connecting member D0y6 connects one ends of the elongate members D0x7 and D0x8 to each other. The connecting member D0y7 connects the other end of the elongate member D0x8 and one end of the elongate member D0x9 to each other. The connecting member D0y8 connects the other end of the elongate member D0x9 and one end of the elongate members D0x10 to each other. The connecting member D0y9 connects the other end of the elongate member D0x10 and one end of the elongate member D0x11 to each other. The connecting member D0y10 connects the other end of the elongate member D0x11 and one end of the elongate member D0x12 to each other.

The contact region D0c2 is connected to the other end of the elongate member D0x7 and electrically connects contacts CS2 and the elongate member D0x7 to each other. Accordingly, the contact region D0c2 is electrically connected to the contact region GRc2 via the contacts CS2. That is, one end (D0c2) of the wiring layer D0_2 is electrically connected to the other end of the resistive member GR.

The contact region D0c4 is connected to the other end of the elongate member D0x12 and electrically connects a contact V0_2 and the elongate member D0x12 to each other. Accordingly, the contact region D0c4 is electrically connected to the wiring layer D1 located above the wiring layer D0 via the contact V0_2. That is, the other end (D0c4) of the wiring layer D0_2 is electrically connected to one end of the wiring layer D1.

As described above, in the second embodiment, the elongate members D0x1 to D0x6 having the longitudinal direction in the X direction are arrayed in the Y direction, and the connecting members D0y1 to D0y5 extending in the Y direction alternately connect the end portions of the elongate members D0x1 to D0x6 in a continuous manner. Accordingly, the wiring layer D0_1 has a spiral shape in the planar view as viewed from the Z direction. Similarly, the elongate members D0x7 to D0x12 having the longitudinal direction in the X direction are arrayed in the Y direction, and the connecting members D0y6 to D0y10 extending in the Y direction alternately connect the end portions of the elongate members D0x7 to D0x12 to be continuous. Accordingly, the wiring layer D0_2 has a spiral shape in the planar view as viewed from the Z direction.

The two wiring layers D0_1 and D0_2 are electrically separated from each other. The wiring layer D0_1 is electrically connected between the contact region GRc1 at one end of the resistive member GR and one end of the wiring layer D1. The wiring layer D0_2 is electrically connected between the contact region GRc2 at the other end of the resistive member GR and the other end of the wiring layer D1.

The resistive member GR and the wiring layers D1 to D5 may be configured in a spiral shape similarly to the wiring layer D0 in FIG. 7, or may have a meandering shape similarly to those in the first embodiment. For example, the wiring layer D1 is provided above the resistive member GR and the wiring layer D0, may be spiral in the planar view as viewed from above the front face F10 of the substrate 10, and overlaps with the resistive member GR and the wiring layer D0.

Figure 8:
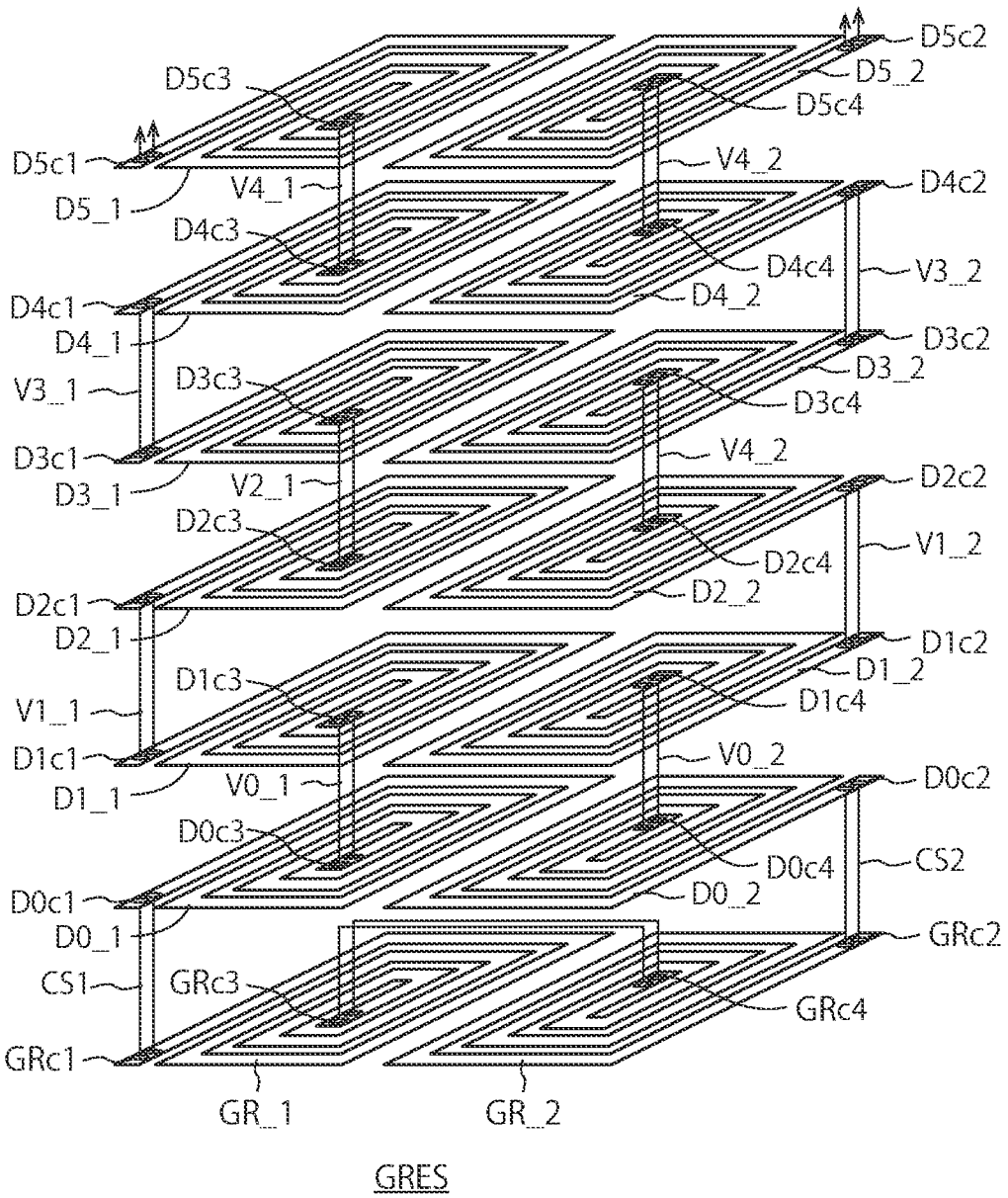
FIG. 8 is a schematic perspective view illustrating a configuration example of the entire gate resistive element.

FIG. 8 is a schematic perspective view illustrating a configuration example of the entire gate resistive element GRES. The resistive member GR has two spiral lines GR_1 and GR_2. The lines GR_1 and GR_2 are electrically separated from each other. The contact regions GRc1 and GRc2 at one ends of the lines GR_1 and GR_2 are arranged at diagonal positions (end portions of spirals) of the formation region Rgr of the gate resistive element GRES in FIG. 3, respectively. Contact regions GRc3 and GRc4 at the other ends of the lines GR_1 and GR_2 are arranged inside (substantially at the center of spirals) of the formation region Rgr, respectively, and are electrically connected to each other. The contact regions GRc3 and GRc4 may be connected with a different line or impurity diffused layer (not illustrated), or the like. The contact regions GRc1 and GRc2 are electrically connected to the contact regions D0c1 and D0c2 of the wiring layer D0 via the contacts CS1 and CS2, respectively.

The two wiring layers D0_1 and D0_2 of the wiring layer D0 are both spiral and are electrically separated from each other. The contact regions D0c1 and D0c2 at one ends of the wiring layers D0_1 and D0_2 are arranged at the diagonal positions (end portions of spirals) of the formation region Rgr, respectively, and the contact regions D0c3 and D0c4 at the other ends are arranged inside (substantially at the center of spirals) of the formation region Rgr, respectively. The contact regions D0c3 and D0c4 are electrically connected to the contact regions D1c3 and D1c4 of the wiring layer D1 via the contacts V0_1 and V0_2, respectively.

The two wiring layers D1_1 and D1_2 of the wiring layer D1 are both spiral and are electrically separated from each other. The contact regions D1c3 and D1c4 at one ends of the wiring layers D1_1 and D1_2 are arranged inside (substantially at the center of spirals) of the formation region Rgr, respectively, and the contact regions D1c1 and D1c2 at the other ends are arranged at the diagonal positions (end portions of spirals) of the formation region Rgr, respectively. The contact regions D1c1 and D1c2 are electrically connected to the contact regions D2c1 and D2c2 of the wiring layer D2 via the contacts V1_1 and V1_2, respectively.

The two wiring layers D2_1 and D2_2 of the wiring layer D2 are both spiral and are electrically separated from each other. The contact regions D2c1 and D2c2 at one ends of the wiring layers D2_1 and D2_2 are arranged at the diagonal positions (end portions of spirals) of the formation region Rgr, respectively, and the contact regions D2c3 and D2c4 at the other ends are arranged inside (substantially at the center of spirals) of the formation region Rgr, respectively. The contact regions D2c3 and D2c4 are electrically connected to the contact regions D3c3 and D3c4 of the wiring layer D3 via the contacts V2_1 and V2_2, respectively.

The two wiring layers D3_1 and D3_2 of the wiring layer D3 are both spiral and are electrically separated from each other. The contact regions D3c3 and D3c4 at one ends of the wiring layers D3_1 and D3_2 are arranged inside (substantially at the center of spirals) of the formation region Rgr, respectively, and the contact regions D3c1 and D3c2 at the other ends are arranged at the diagonal positions (end portions of spirals) of the formation region Rgr, respectively. The contact regions D3c1 and D3c2 are electrically connected to the contact regions D4c1 and D4c2 of the wiring layer D4 via the contacts V3_1 and V3_2, respectively.

The two wiring layers D4_1 and D4_2 of the wiring layer D4 are both spiral and are electrically separated from each other. The contact regions D4c1 and D4c2 at one ends of the wiring layers D4_1 and D4_2 are arranged at the diagonal positions (end portions of spirals) of the formation region Rgr, respectively, and the contact regions D4c3 and D4c4 at the other ends are arranged inside (substantially at the center of spirals) of the formation region Rgr, respectively. The contact regions D4c3 and D4c4 are electrically connected to the contact regions D5c3 and D5c4 of the wiring layer D5 via the contacts V4_1 and V4_2, respectively.

The two wiring layers D5_1 and D5_2 of the wiring layer D5 are both spiral and are electrically separated from each other. The contact regions D5c3 and D5c4 at one ends of the wiring layers D5_1 and D5_2 are arranged inside (substantially at the center of spirals) of the formation region Rgr, respectively, and the contact regions D5c1 and D5c2 at the other ends are arranged at the diagonal positions (end portions of spirals) of the formation region Rgr, respectively. The contact regions D5c1 and D5c2 are electrically connected to any semiconductor elements of the CMOS chip CH1 (not illustrated), respectively.

Accordingly, the wiring layers D0_1 to D0_5 that are respectively ones of the wiring layers D0 to D5 are electrically connected to both ends of the resistive member GR while being electrically separated from the other wiring layers D0_2 to D5_2 of the wiring layers D0 to D5, respectively. The other wiring layers D0_2 to D5_2 of the wiring layers D0 to D5 are electrically connected to the other end of the resistive member GR.

The connection locations of the resistive member GR and the wiring layers D0 to D5 are alternately arranged at the diagonal positions (end portions of spirals) of the formation region Rgr of the gate resistive element GRES and positions (positions substantially at the center of spirals) inside the formation region Rgr in each of the layers from the bottom to the top. Accordingly, the gate resistive element GRES according to the present embodiment is wired in a spiral manner in the resistive member GR and the wiring layers D0 to D5 while alternately passing the diagonal positions and the positions near the center of the formation region Rgr. Since the gate resistive element GRES is formed in the spiral manner not only in the resistive member GR but also in the wiring layers D0 to D5 stacked thereon, the wiring distance is increased. As a result, the gate resistive element GRES can be easily set to a resistance value in a desired range while it is constituted of a material low in the sheet resistance and is small in the planar layout area.

The rest of the configuration in the second embodiment may be identical to that in the first embodiment. Accordingly, the second embodiment can also obtain the effects of the first embodiment.

(Modification)

Figure 9:
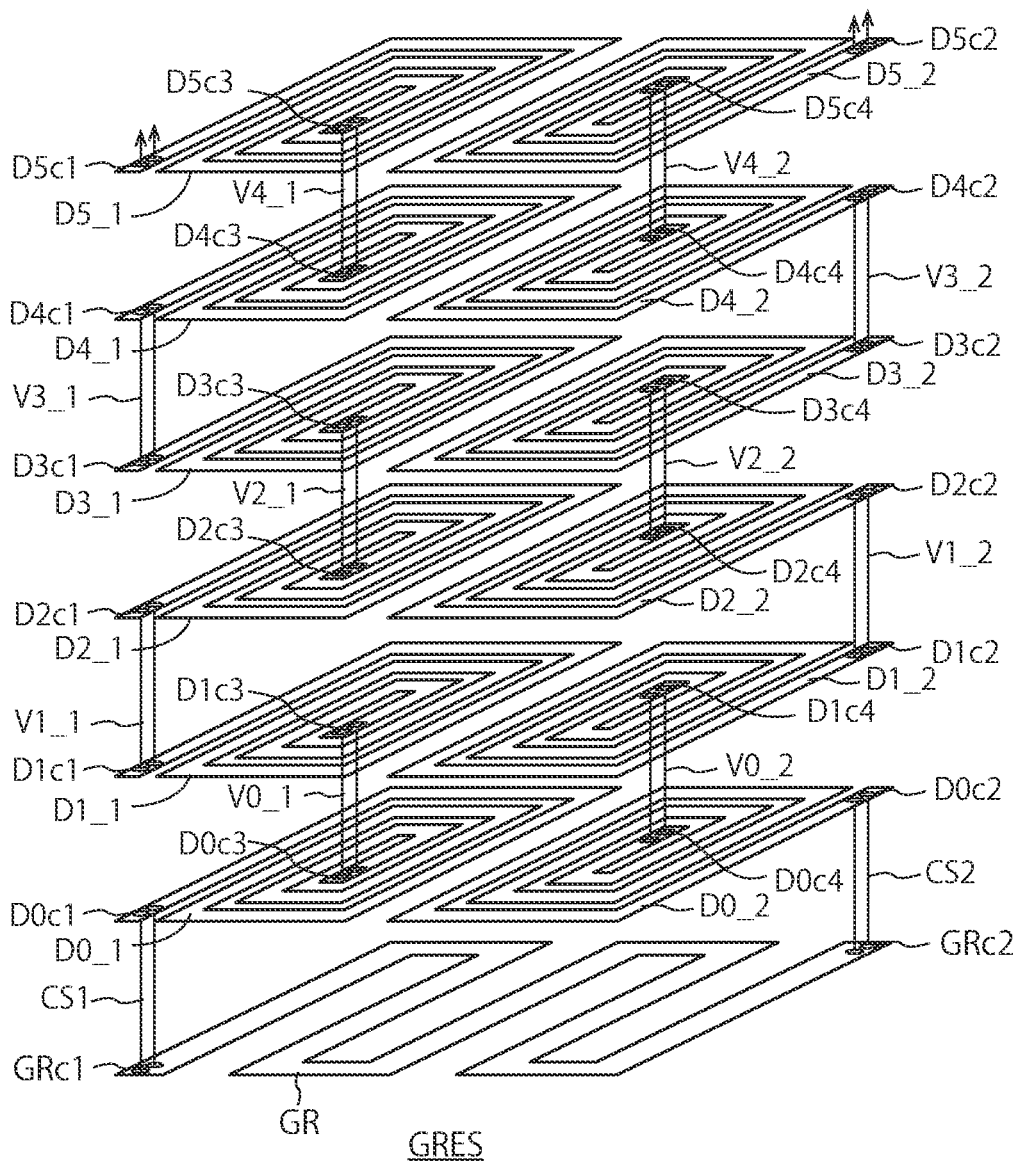
FIG. 9 is a schematic perspective view illustrating a configuration example of the entire gate resistive element according to a modification of the second embodiment.

FIG. 9 is a schematic perspective view illustrating a configuration example of the entire gate resistive element GRES according to a modification of the second embodiment. In the present modification, the resistive member GR is one meandering line similarly to that in the first embodiment, and other wiring layers D0 to D5 have a spiral configuration similarly to that in the second embodiment. Even with these configurations, the effects identical to those of the first and second embodiments can be obtained.

Although not illustrated in the drawings, each of the resistive member GR and the wiring layers D0 to D5 may have any one of a spiral configuration and a meandering configuration.

Third Embodiment

Figure 10:
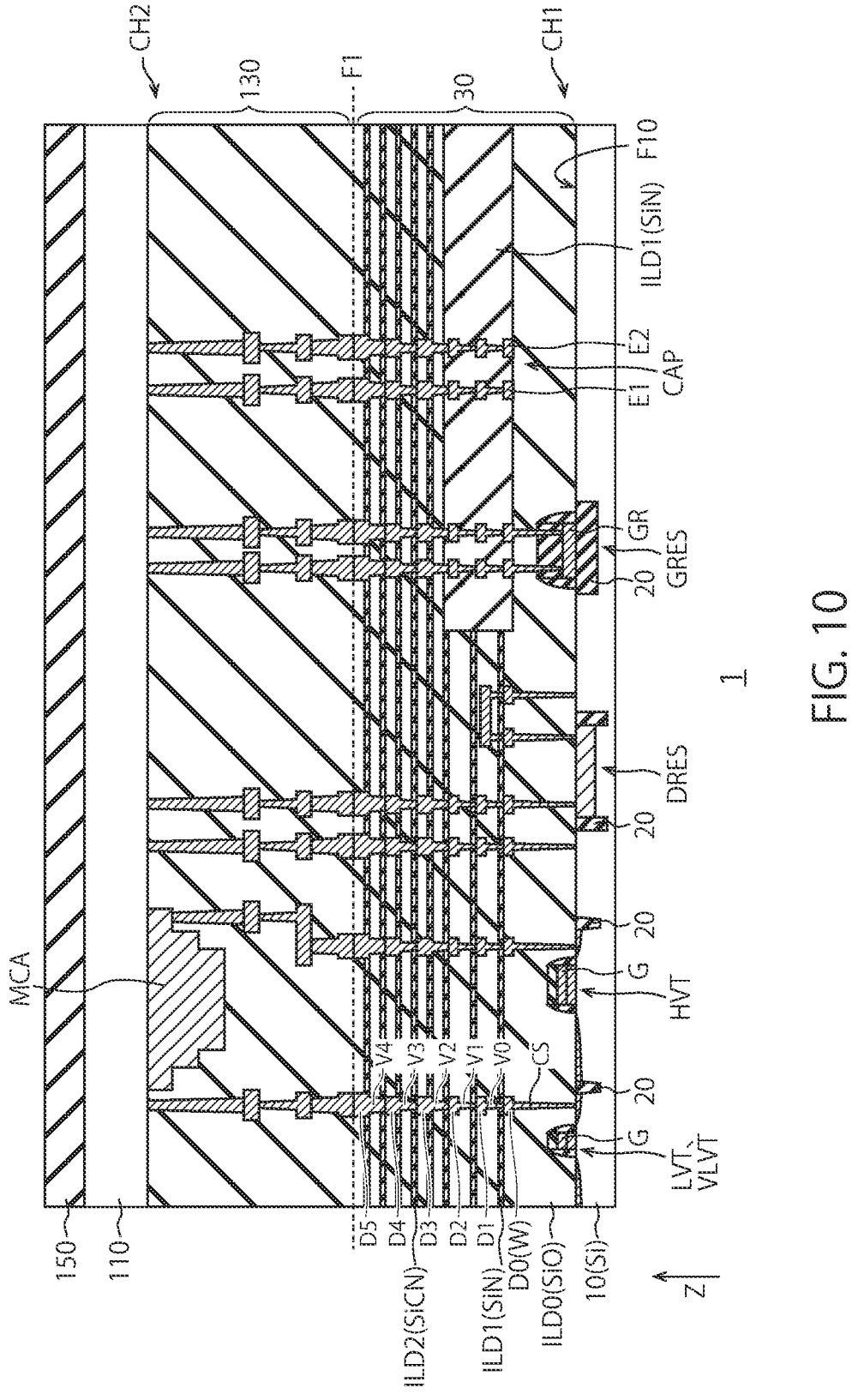
FIG. 10 is a cross-sectional view illustrating a configuration example of a semiconductor device according to a third embodiment.
Figure 11:
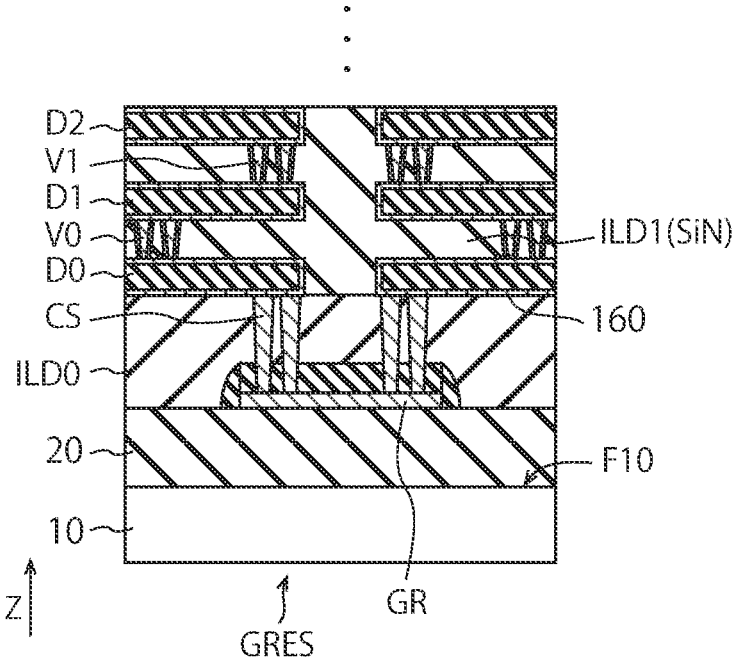
FIG. 11 is a cross-sectional view illustrating a configuration example of the semiconductor device according to the third embodiment.

FIGS. 10 and 11 are cross-sectional views illustrating a configuration example of a semiconductor device according to a third embodiment. FIG. 11 is a cross-sectional view illustrating a configuration example of the gate resistive element GRES in more detail.

In the third embodiment, an insulating layer ILD1 constituted of a silicon nitride film is provided around the wiring layers D0 to D3 of the gate resistive element GRES and between the electrode E1 and the electrode E2 of the capacitive element CAP.

With the silicon nitride film coating around the wiring layers D0 to D3, the surfaces of the wiring layers D0 to D3 are nitrided and the metallic material (for example, tungsten) becomes a metallic nitride film (for example, tungsten nitride) 160 having a higher resistance than that of the metallic material. The metallic nitride film 160 is provided between the wiring layers D0 to D3 and the insulating layer ILD1 and coats the surfaces of the wiring layers D0 to D3. With the nitriding of the surfaces of the wiring layers D0 to D3, the sheet resistances of the wiring layers D0 to D3 are increased. This enables the length of the line of the gate resistive element GRES to be shortened and enables the layout area in the planar view as viewed from the Z direction to be further reduced while maintaining the resistance value of the gate resistive element GRES.

The insulating layer ILD1 may be provided on all the surfaces of the wiring layers D0 to D5 or may be provided on the surfaces of some of the wiring layers D0 to D5. That is, the metallic nitride film 160 may be provided on all the surfaces of the wiring layers D0 to D5 or may be provided on the surfaces of some of the wiring layers D0 to D5.

As illustrated in FIG. 10, the insulating layer ILD1 constituted of a silicon nitride film is provided also between the electrode E1 and the electrode E2 of the capacitive element CAP. The silicon nitride film is higher in relative permittivity than a silicon dioxide film. Therefore, the capacitance of the capacitive element CAP can be increased. Alternatively, the layout areas of the electrodes E1 and E2 in the planar view as viewed from the Z direction can be reduced while the capacitance of the capacitive element CAP is maintained.

Meanwhile, an insulating layer ILD0 constituted of a silicon dioxide film or an insulating layer ILD2 constituted of a silicon carbonitride film (SiCN) is provided between the wiring layers D0 to D5 of the multi-layered wiring layer 30 on the transistors VLVT, LVT, and HVT and the diffusion resistive element DRES.

With this selective provision of the silicon nitride film around the wiring layers D0 to D5 of the gate resistive element GRES and/or the electrodes E1 and E2 of the capacitive element CAP, the layout area of the gate resistive element GRES and/or the capacitive element CAP can be reduced without degrading the electrical characteristics of the transistors VLVT, LVT, and HVT.

(Manufacturing Method of Semiconductor Device)

Figure 12:
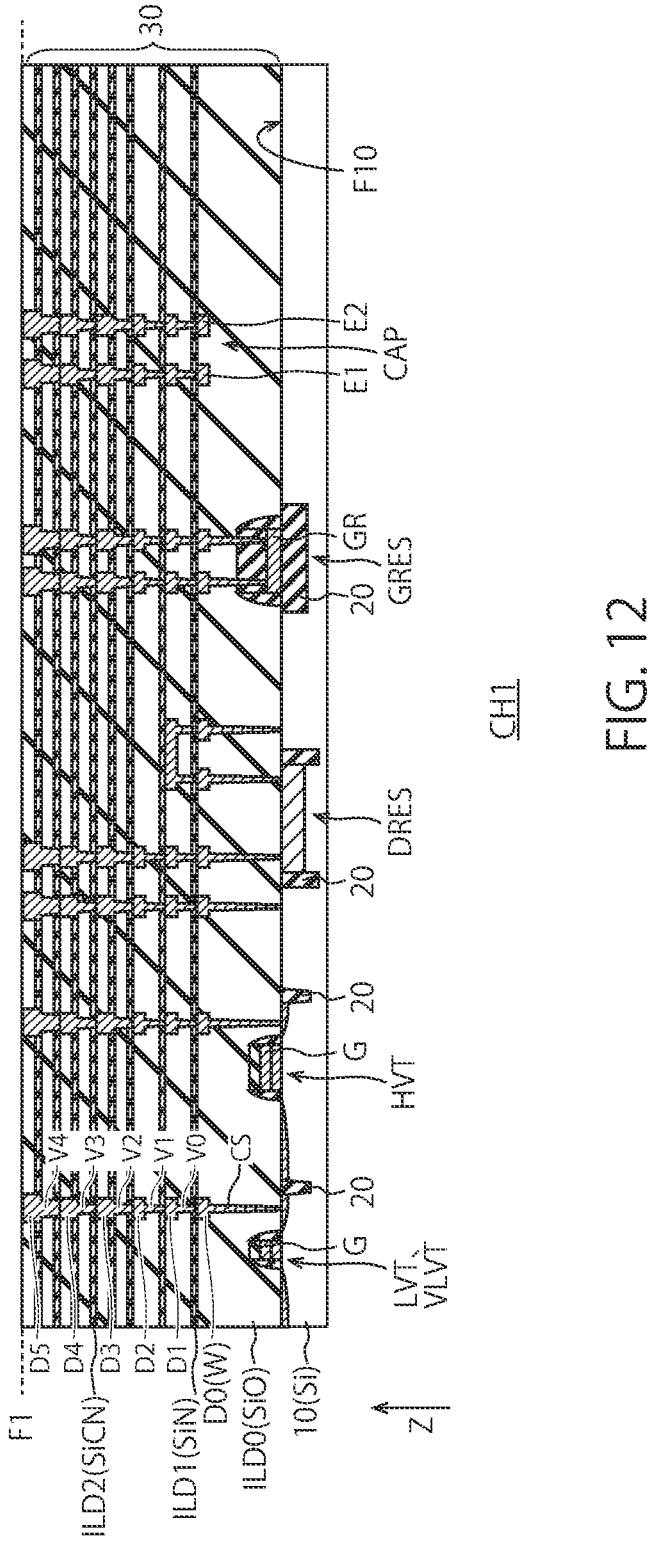
FIG. 12 is a cross-sectional view illustrating an example of a manufacturing method of a semiconductor device according to the first embodiment.
Figure 13:
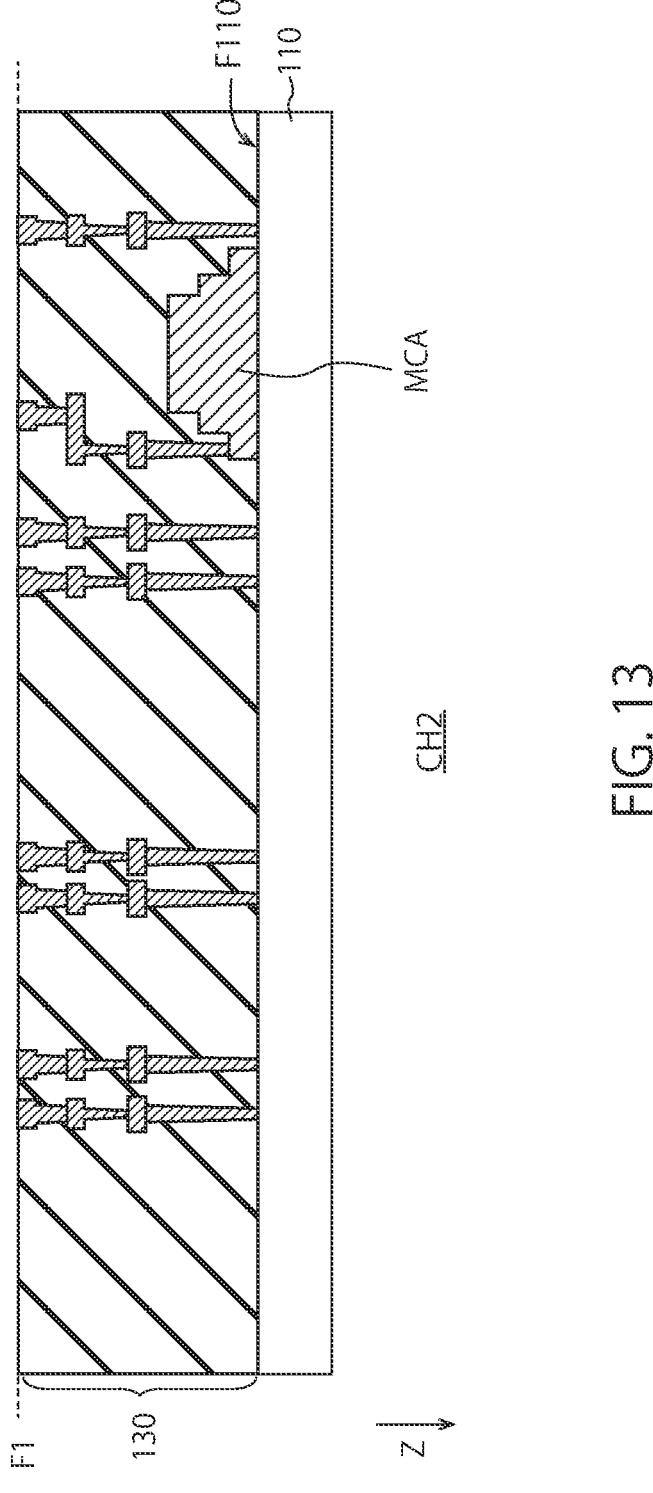
FIG. 13 is a cross-sectional view illustrating an example of the manufacturing method of a semiconductor device according to the first embodiment.

FIGS. 12 and 13 are cross-sectional views illustrating an example of a manufacturing method of a semiconductor device according to the first embodiment. As illustrated in FIG. 12, semiconductor elements such as the transistors VLVT, LVT, and HVT, the diffusion resistive element DRES, the gate resistive element GRES, and the capacitive element CAP are formed on the front face F10 of the substrate 10. The multi-layered wiring layer 30 is formed on the semiconductor elements. The wiring layer D5 or bonding pads (not illustrated) are exposed on the bonding face F1. The silicon nitride film of the insulating layer ILD1 functions as an etching stopper at the time of formation of the contacts V0 to V4.

Meanwhile, as illustrated in FIG. 13, the memory cell array MCA is formed on a front face F110 of the substrate 110 different from the substrate 10. The multi-layered wiring layer 130 is formed on the memory cell array MCA. A part of the multi-layered wiring layer 130 or bonding pads are exposed on the bonding face F1.

Next, the substrate 10 and the substrate 110 are bonded on the bonding face F1. At this time, the wiring layer D5 of the multi-layered wiring layer 30 or the bonding pads are electrically connected to a wiring layer of the multi-layered wiring layer 130 or the bonding pads corresponding thereto, respectively. Accordingly, a structure illustrated in FIG. 1 is obtained.

Subsequently, the metallic layer 150 is formed on the substrate 110, so that the semiconductor device 1 according to the first embodiment is completed.

Figure 14:
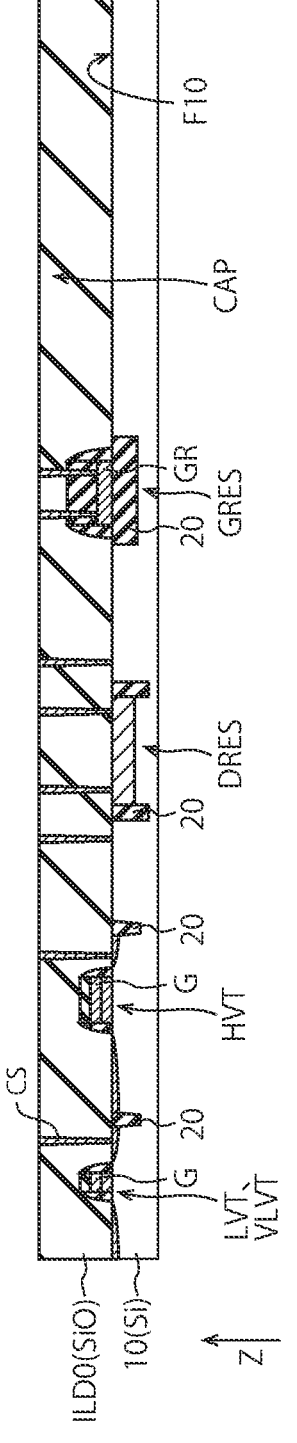
FIG. 14 is a cross-sectional view illustrating an example of a manufacturing method of a semiconductor device according to the second embodiment.

FIGS. 14 to 21 are cross-sectional views illustrating an example of a manufacturing method of a semiconductor device according to the second embodiment. As illustrated in FIG. 14, after the transistors VLVT, LVT, and HVT, the diffusion resistive element DRES, and the resistive member GR are formed on the substrate 10, an insulating layer ILD0 and the contacts CS are formed thereon. The insulating layer ILD0 is, for example, a silicon dioxide film. Another silicon dioxide film is deposited on the insulating layer ILD0 to thicken the insulating layer ILD0.

Figure 15:
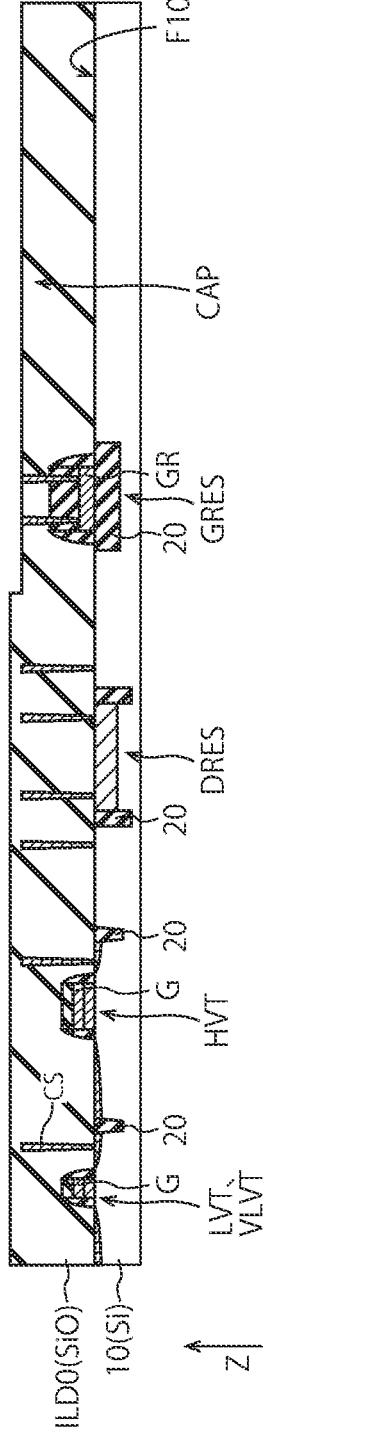
FIG. 15 is a cross-sectional view illustrating the manufacturing method of a semiconductor device in continuation from FIG. 14.

Next, as illustrated in FIG. 15, the insulating layer ILD0 in the formation region of the gate resistive element GRES and the capacitive element CAP is selectively etched using a lithography technique and an etching technique to expose the contacts CS of the gate resistive element GRES.

Figure 16:
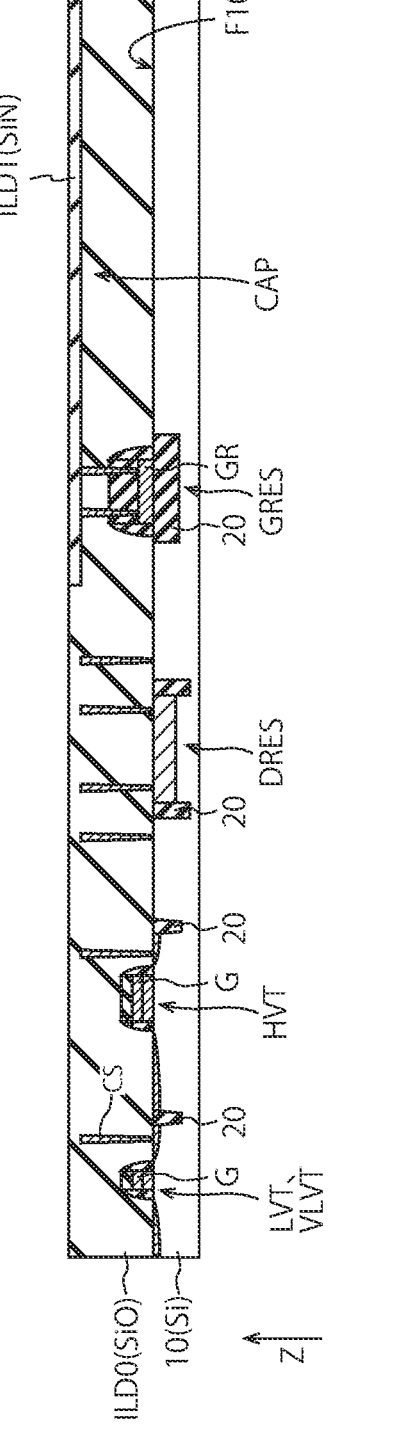
FIG. 16 is a cross-sectional view illustrating the manufacturing method of a semiconductor device in continuation from FIG. 15.

Next, as illustrated in FIG. 16, an insulating layer ILD1 is deposited on the insulating layer ILD0 and is flattened using a CMP (Chemical Mechanical Polishing) method or the like.

This causes the insulating layer ILD1 to be selectively remained in the formation region of the gate resistive element GRES and the capacitive element CAP.

Figure 17:
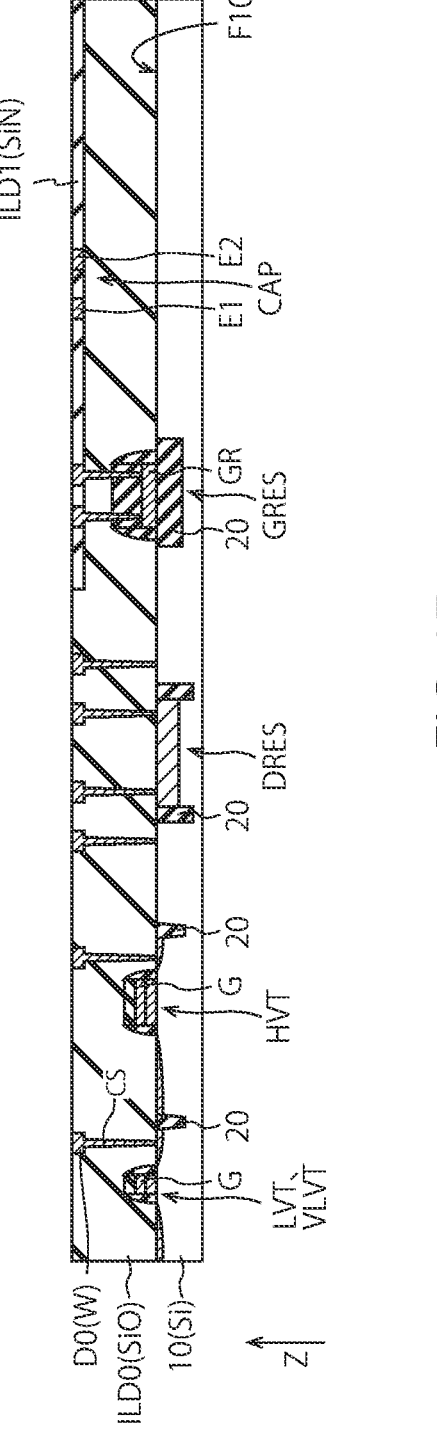
FIG. 17 is a cross-sectional view illustrating the manufacturing method of a semiconductor device in continuation from FIG. 16.

Subsequently, as illustrated in FIG. 17, a groove is formed on the insulating layers ILD0 and ILD1 located on the contacts CS using a lithography technique and an etching technique, and the wiring layer D0 is embedded in the groove on the contacts CS. The groove in which the wiring layer D0 is embedded in the formation region of the gate resistive element GRES is formed in a predetermined pattern (for example, a meandering shape or a spiral shape) by a lithography technique. This enables the wiring layer D0 to be formed in, for example, the meandering shape or the spiral shape. At this time, the wiring layer D0 is formed in the insulating layer ILD0 above the transistors VLVT, LVT, and HVT and the diffusion resistive element DRES and is formed in the insulating layer ILD1 in the formation region of the gate resistive element GRES and the capacitive element CAP.

Figure 18:
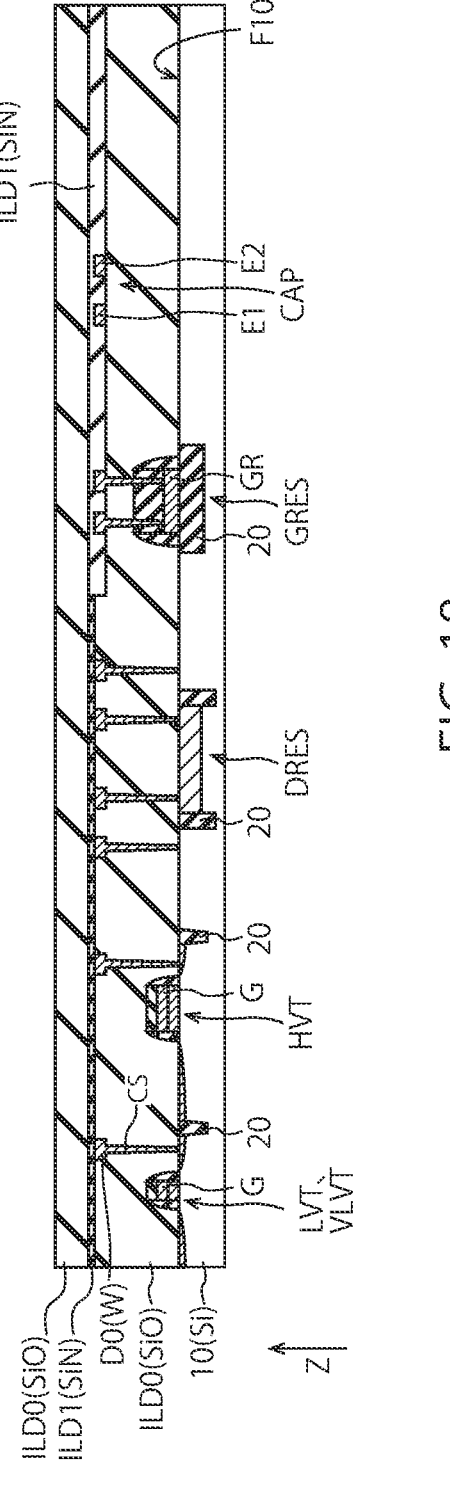
FIG. 18 is a cross-sectional view illustrating the manufacturing method of a semiconductor device in continuation from FIG. 17.

Next, as illustrated in FIG. 18, an insulating layer ILD1 (for example, a silicon nitride film) for a stopper is formed on the insulating layers ILD0 and ILD1, and an insulating layer ILD0 (for example, a silicon dioxide film) is formed on the insulating layer ILD1.

Next, the insulating layer ILD0 in the formation region of the gate resistive element GRES and the capacitive element CAP is selectively etched using a lithography technique and an etching technique to expose the wiring layer D0 located in the formation region of the gate resistive element GRES and the capacitive element CAP in the manner as explained with reference to FIG. 15.

Figure 19:
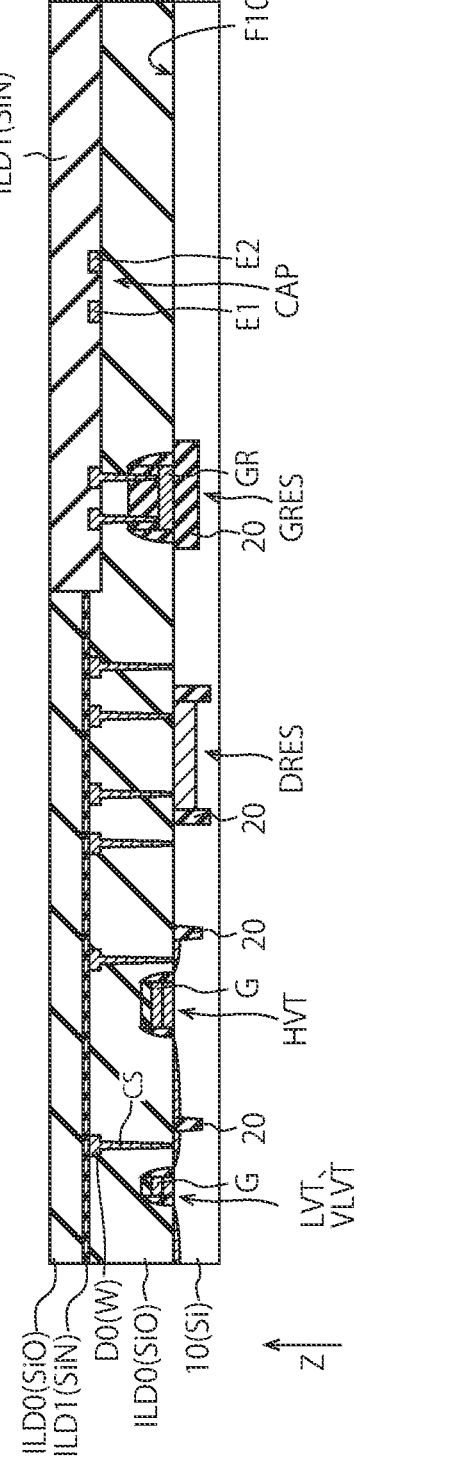
FIG. 19 is a cross-sectional view illustrating the manufacturing method of a semiconductor device in continuation from FIG. 18.

Subsequently, an insulating layer ILD1 is deposited on the insulating layer ILD0 and is flattened using the CMP method or the like in the manner as explained with reference to FIG. 16. This causes the insulating layer ILD1 to be selectively remained in the formation region of the gate resistive element GRES and the capacitive element CAP as illustrated in FIG. 19.

Figure 20:
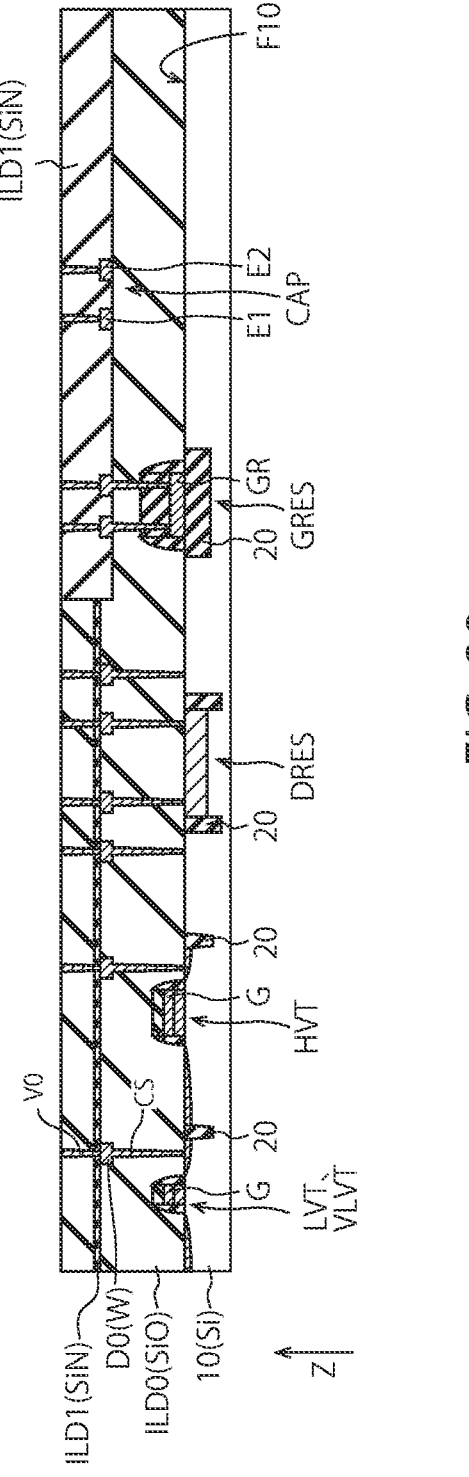
FIG. 20 is a cross-sectional view illustrating the manufacturing method of a semiconductor device in continuation from FIG. 19.

Next, the insulating layers ILD0 and ILD1 located on the wiring layer D0 are removed using a lithography technique and an etching technique to form a via hole and the contact V0 is formed therein. A structure illustrated in FIG. 20 is thereby obtained. The insulating layer ILD1 functions as an etching stopper at the time of formation of the via hole. The contact V0 is formed on the wiring layer D0 and is connected to the wiring layer D0.

Figure 21:
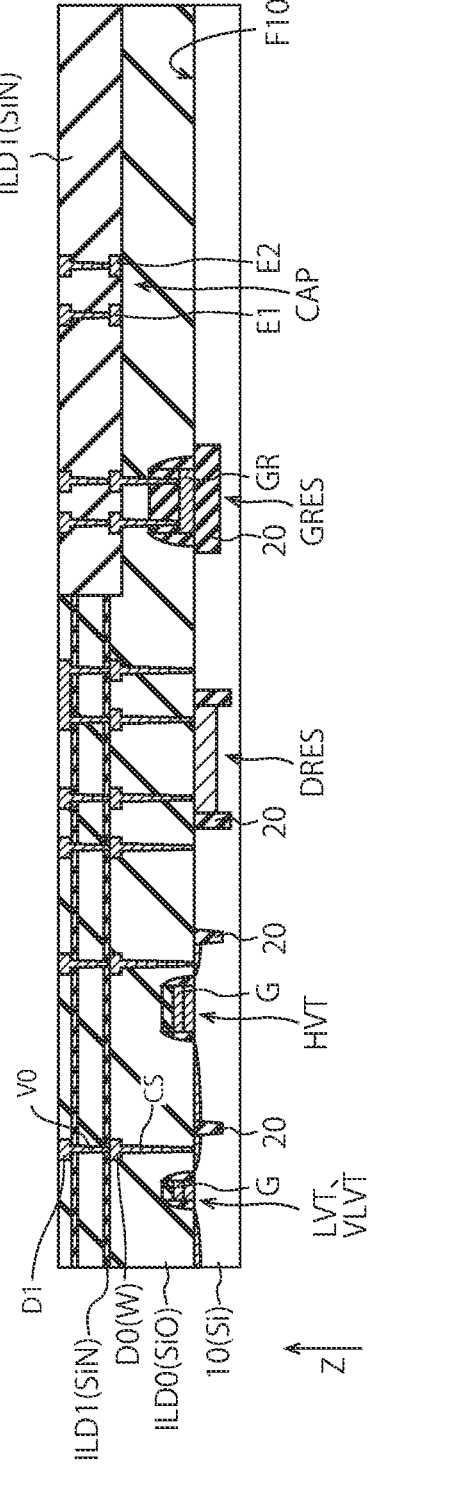
FIG. 21 is a cross-sectional view illustrating the manufacturing method of a semiconductor device in continuation from FIG. 20.

Next, the wiring layer D1 is formed in the same manner as in the formation process of the wiring layer D0. A structure illustrated in FIG. 21 is thereby obtained. The same process is subsequently repeated to form the contacts V1 to V4 and the wiring layers D2 to D5. Accordingly, the structure of the CMOS chip CH1 in FIG. 10 is obtained.

Meanwhile, the manufacturing method of the cell array chip CH2 may be the same as that in the first embodiment. The semiconductor device according to the second embodiment is completed by bonding the CMOS chip CH1 and the cell array chip CH2 to each other.

Figure 22:
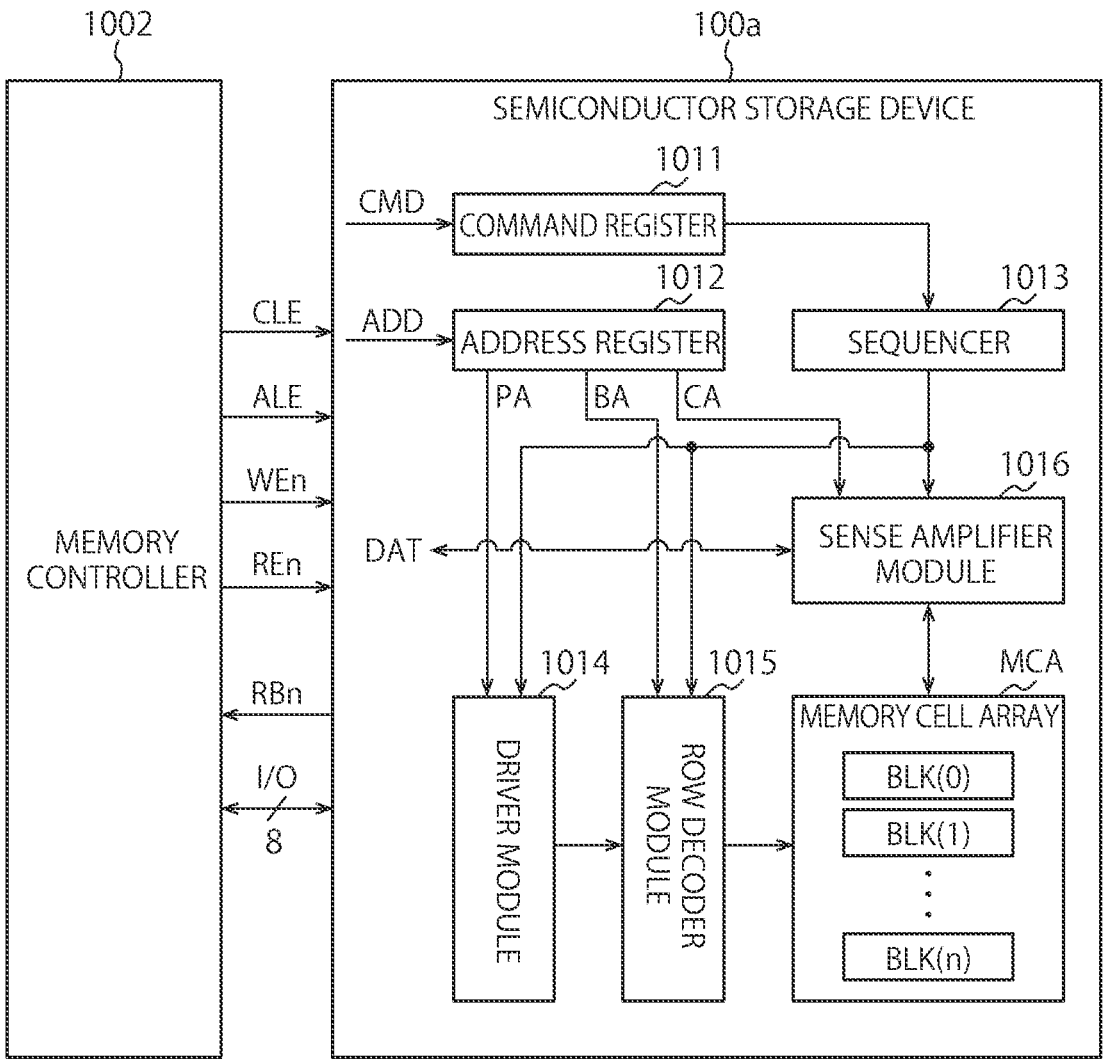
FIG. 22 is a block diagram illustrating a configuration example of a semiconductor device to which any of the above embodiments is applied.

FIG. 22 is a block diagram illustrating a configuration example of a semiconductor device to which any of the above embodiments is applied. The semiconductor device 1 is, for example, a semiconductor storage device 100a, such as a NAND flash memory, that can store data therein in a non-volatile manner, and is controlled by an external memory controller 1002. Communication between the semiconductor storage device 100a and the memory controller 1002 supports, for example, a NAND interface standard.

As illustrated in FIG. 22, the semiconductor storage device 100a includes, for example, a memory cell array MCA, a command resister 1011, an address resister 1012, a sequencer 1013, a driver module 1014, a row decoder module 1015, and a sense amplifier module 1016.

The memory cell array MCA includes a plurality of blocks BLK(0) to BLK(n) (n is an integer of 1 or more). Each block BLK is a set of a plurality of memory cells capable of storing therein data in a non-volatile manner and is used as, for example, the unit of erasing data. Further, the memory cell array MCA is provided with a plurality of bit lines and a plurality of word lines. Each memory cell is associated with one bit line and one word line, for example. The detailed configuration of the memory cell array MCA will be described later.

The command resister 1011 retains a command CMD the semiconductor storage device 100a has received from the memory controller 1002. The command CMD includes, for example, an instruction to cause the sequencer 1013 to perform a read operation, a write operation, an erase operation, or the like.

The address resister 1012 retains address information ADD the semiconductor storage device 100a has received from the memory controller 1002. The address information ADD includes, for example, a block address BA, a page address PA, and a column address CA. For example, the block address BA, the page address PA, and the column address CA are used for selecting the blocks BLK, the word lines, and the bit lines, respectively.

The sequencer 1013 controls the operation of the entire semiconductor storage device 100a. For example, the sequencer 1013 controls the driver module 1014, the row decoder module 1015, the sense amplifier module 1016, and the like based on the command CMD retained in the command resister 1011 to perform a read operation, a write operation, an erase operation, or the like.

The driver module 1014 generates a voltage to be used in a read operation, a write operation, an erase operation, or the like. The driver module 1014 then applies the generated voltage to a signal line corresponding to a selected word line based on, for example, the page address PA retained in the address register 1012.

The row decoder module 1015 includes a plurality of row decoders. The row decoder selects, based on the block address BA retained in the address resister 1012, one block BLK in the memory cell array MCA corresponding to that address. The row decoder then transfers, for example, the voltage applied to the signal line corresponding to the selected word line to the selected word line in the selected block BLK.

The sense amplifier module 1016 applies a desired voltage to each bit line in accordance with write data DAT received from the memory controller 1002 in a write operation. Further, in a read operation, the sense amplifier module 1016 determines data stored in a memory cell based on a voltage of a bit line, reads out the determination result, and transfers the determination result as data DAT to the memory controller 1002.

The semiconductor storage device 100a and the memory controller 1002 described above may be combined with each other to constitute one semiconductor device. Examples of such a semiconductor device include a memory card such an SDTM card, and an SSD (solid state drive).

Figure 23:
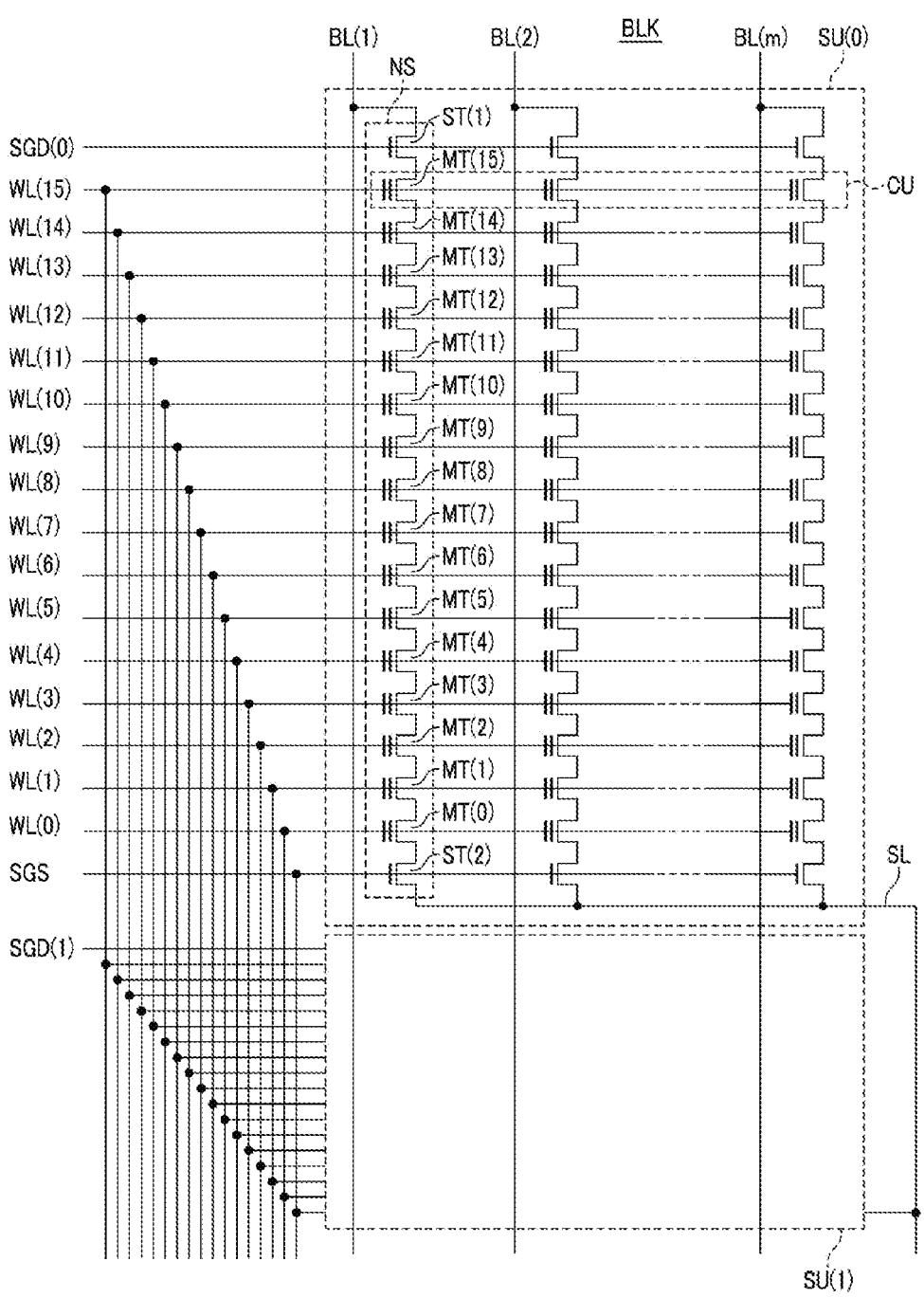
FIG. 23 is a circuit diagram illustrating an example of a circuit configuration of a memory cell array.

FIG. 23 is a circuit diagram illustrating an example of a circuit configuration of the memory cell array MCA. One block BLK is extracted from the blocks BLK included in the memory cell array MCA. As illustrated in FIG. 23, the block BLK includes a plurality of string units SU(0) to SU(k) (k is an integer of 1 or more).

Each string unit SU includes a plurality of NAND strings NS respectively associated with bit lines BL(0) to BL(m) (m is an integer of 1 or more). Each NAND string NS includes, for example, memory cell transistors MT(0) to MT(15) and selection transistors ST(1) and ST(2). The memory cell transistor MT includes a control gate and a charge storage layer and retains data in a non-volatile manner. Each of the selection transistors ST(1) and ST(2) is used for selecting the string units SU in various operations.

In each NAND string NS, the memory cell transistors MT(0) to MT(15) are connected in series. A drain of the selection transistor ST(1) is connected to a bit line BL associated therewith, and a source of the selection transistor ST(1) is connected to one end of the memory cell transistors MT(0) to MT(15) connected in series. A drain of the selection transistor ST(2) is connected to the other end of the memory cell transistors MT(0) to MT(15) connected in series. A source of the selection transistor ST(2) is connected to a source line SL.

In the same block BLK, the control gates of the memory cell transistors MT(0) to MT(15) are connected in common to word lines WL(0) to WL(15). Gates of the selection transistors ST(1) in each of the string units SU(0) to SU(k) are connected in common to a corresponding one of selection gate lines SGD(0) to SGD(k). Gates of the selection transistors ST(2) are connected in common to a selection gate line SGS.

In the circuit configuration of the memory cell array MCA described above, each bit line BL is shared by the NAND strings NS, to which the same column address is assigned, in each string unit SU. The source line SL is shared by, for example, the blocks BLK.

A set of the memory cell transistors MT connected to the common word line WL in one string unit SU is referred to as, for example, a cell unit CU. For example, the storage capacity of the cell unit CU including the memory cell transistors MT each storing therein 1-bit data is defined as "1-page data". The cell unit CU can have a storage capacity of 2-page data or more in accordance with the number of bits of data stored in the memory cell transistors MT.

The memory cell array MCA included in the semiconductor storage device 100*a* according to the present embodiment is not limited to the circuit configuration described above. For example, the number of the memory cell transistors MT and the number of the selection transistors ST(1) and ST(2) included in each NAND string NS can be designed to be any number. The number of the string units SU included in each block BLK can be designed to be any number.

Figure 24:
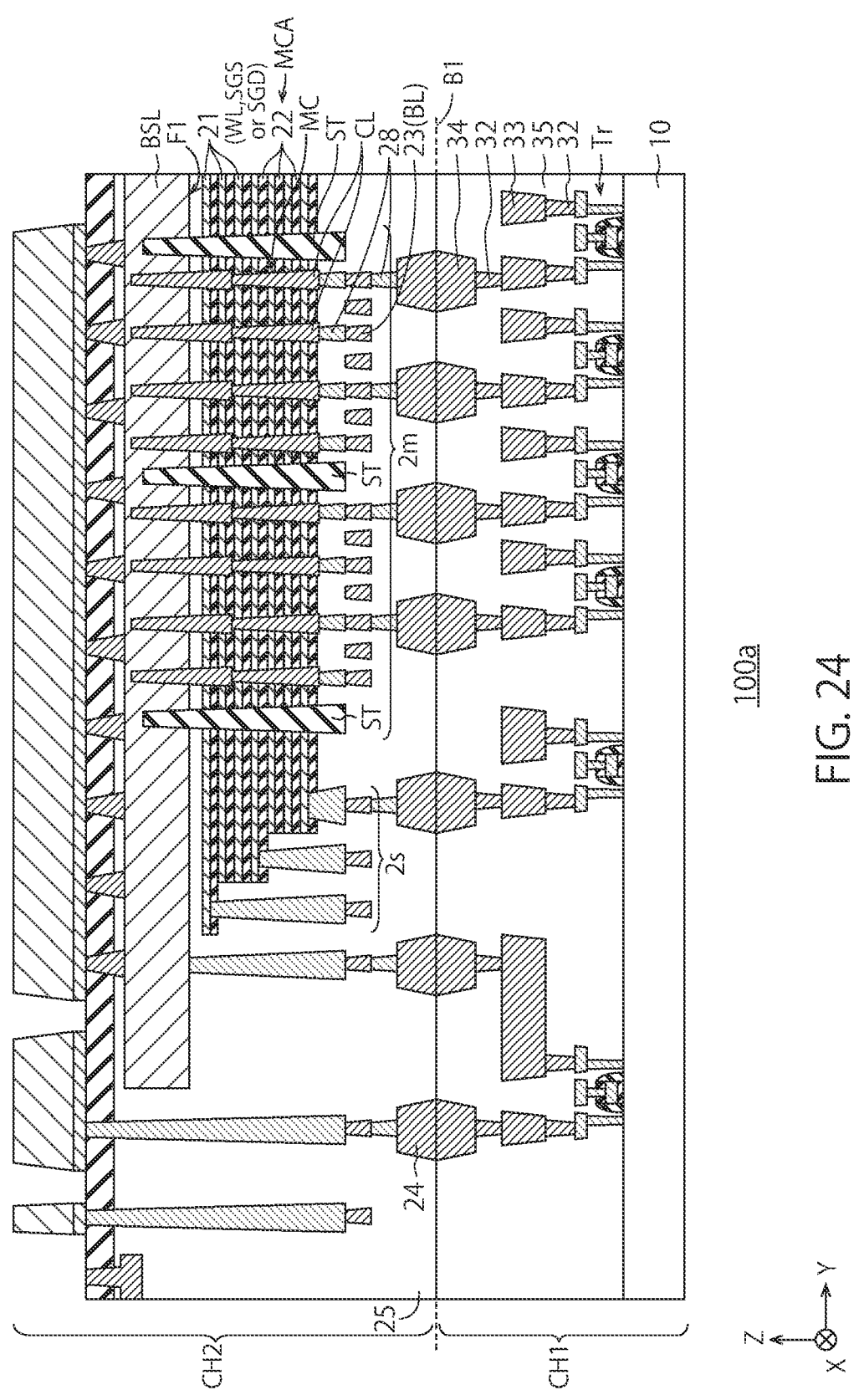
FIG. 24 is a cross-sectional view illustrating a configuration example of a semiconductor storage device.

FIG. 24 is a cross-sectional view illustrating a configuration example of the semiconductor storage device 100*a*. The semiconductor storage device 100*a* includes the cell array chip CH2 having a memory cell array and the CMOS chip CH1 having a CMOS circuit. The cell array chip CH2 and the CMOS chip CH1 are bonded together at the bonding surface B1 at which they are electrically connected to each other via wires 24 and 34 joined to each other. FIG. 24 illustrates a state where the cell array chip CH2 is placed on the CMOS chip CH1.

The configurations of the memory cell array MCA of the cell array chip CH2 and the CMOS circuit may be identical to those of the embodiments described above, respectively.

In the present embodiment, the cell array chip CH2 and the CMOS chip CH1 are formed separately and these chips are bonded together at the bonding surface B1.

In the CMOS chip CH1, vias 32, wires 33, and the wires 34 are provided above a transistor Tr. The wires 33 and 34 constitute a multilayer wiring structure in the interlayer dielectric film 35. The wires 34 are embedded in the interlayer dielectric film 35 and exposed in a surface of the interlayer dielectric film 35 to be substantially flush therewith. The wires 33 and 34 are electrically connected to the transistor Tr and the like. A low-resistance metal, such as copper and tungsten, is used for the vias 32 and the wires 33 and 34. The interlayer dielectric film 35 covers and protects the transistors Tr, the vias 32, and the wires 33 and 34. An insulating film, such as a silicon dioxide film, is used as the interlayer dielectric film 35. The CMOS chip CH1 is electrically connected to the memory cell array MCA and functions as a controller that controls the memory cell array MCA.

In the cell array chip CH2, vias 28, wires 23, and the wires 24 are provided below the memory cell array MCA. The wires 23 and 24 constitute a multilayer wiring structure in an interlayer dielectric film 25. The wire 24 is embedded in the interlayer dielectric film 25 and is exposed in a surface of the interlayer dielectric film 25 to be substantially flush therewith. The wires 23 and 24 are electrically connected to, for example, semiconductor bodies of column portions CL. A low-resistance metal, such as copper and tungsten, is used for the vias 28 and the wires 23 and 24. The interlayer dielectric film 25 covers and protects a stack 21, the vias 28, and the wires 23 and 24. An insulating film, such as a silicon dioxide film, is used as the interlayer dielectric film 25.

The interlayer dielectric film 25 and the interlayer dielectric film 35 are bonded together at the bonding surface B1, and the wires 24 and 34 are also joined together at the bonding surface B1 to be substantially flush therewith. Accordingly, the cell array chip CH2 and the CMOS chip CH1 are electrically connected to each other via the wires 24 and 34.

As described above, the present embodiment can be applied to a semiconductor device in which the cell array chip CH2 and the CMOS chip CH1 are bonded together.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a substrate;
   a transistor including a first metallic layer as a gate electrode above a front face of the substrate;
   a first wiring layer including first to third elongate members constituted of a same material as that of the first metallic layer and extending in a first direction in a plane substantially parallel to the front face of the substrate, and first and second connecting members constituted of the same material as that of the first metallic layer, extending in a second direction intersecting with the first direction, and connecting ends portions of the first to third elongate members; and a second wiring layer provided above the first metallic layer, and including fourth to sixth elongate members extending in one of the first and second directions, and third and fourth connecting members constituted of a same material as that of the fourth to sixth elongate members, extending in the other of the first and second directions, and connecting end portions of the fourth to sixth elongate members, wherein one end portions of the first and second wiring layers are electrically connected to each other, the first connecting member connects one ends of the first and second elongate members to each other, the second connecting member connects another end of the second elongate member and one end of the third elongate member to each other, the third connecting member connects one ends of the fourth and fifth elongate members to each other, the fourth connecting member connects another end of the fifth elongate member and one end of the sixth elongate member to each other, and another end of the first elongate member and another end of the fourth elongate member are electrically connected to each other.

2. The device of claim 1, further comprising a contact electrically connecting the another end of the first elongate member and the another end of the fourth elongate member to each other.

3. The device of claim 1, wherein the first to sixth elongate members and the first to fourth connecting members are resistive elements.

4. The device of claim 1, wherein the first to third elongate members and the first and second connecting members have a meandering shape or a spiral shape in a planar view as viewed from above the front face of the substrate, and the fourth to sixth elongate members and the third and fourth connecting members also have a meandering shape or a spiral shape in the planar view as viewed from above the front face of the substrate.

5. The device of claim 1, wherein the second wiring layer includes a plurality of lines electrically separated from each other.

6. The device of claim 1, wherein the first wiring layer is constituted of a film stack including Ti, TiN, and W.

7. The device of claim 6, wherein the second wiring layer is constituted of W.

8. The device of claim 1, further comprising a third wiring layer provided above the second wiring layer, and including seventh to ninth elongate member extending in one of the first and second directions, and fifth and sixth connecting members constituted of a same material as that of the seventh to ninth elongate members, extending in the other of the first and second directions, and connecting end portions of the seventh to ninth elongate members, wherein end portions of the second and third wiring layers are electrically connected to each other.

9. The device of claim 8, wherein the seventh to ninth elongate members and the fifth and sixth connecting members have a meandering shape or a spiral shape in a planar view as viewed from above the front face of the substrate.

10. The device of claim 8, wherein the third wiring layer includes a plurality of lines electrically separated from each other.

11. The device of claim 8, wherein the third wiring layer is constituted of W.

12. The device of claim 8, further comprising a first insulating film provided around the second wiring layer or the third wiring layer and constituted of a silicon nitride film.

13. The device of claim 12, wherein a metallic nitride film is provided on front faces of the second and third wiring layers.

14. The device of claim 1, further comprising a capacitive element including a first electrode and a second electrode provided in a same layer as that of the second wiring layer, and a silicon nitride film provided between the first electrode and the second electrode.

15. The device of claim 1, further comprising a second insulating film provided between wiring layers above the transistor and constituted of a silicon dioxide film.

16. The device of claim 1, further comprising a memory cell array provided above the second wiring layer.

* * * * *